United States Patent [19]
Kinoshita

[11] Patent Number: 6,031,857
[45] Date of Patent: Feb. 29, 2000

[54] SEMICONDUCTOR DEVICE HAVING A CURRENT-CONSTRICTING SPACES AND METHOD OF MANUFACTURING THE DEVICE

[75] Inventor: Junichi Kinoshita, Yokohama, Japan

[73] Assignee: Kabushiki Kaisha Toshiba, Kawasaki, Japan

[21] Appl. No.: 08/859,375

[22] Filed: May 20, 1997

[30] Foreign Application Priority Data

May 21, 1996 [JP] Japan ..................................... 8-125756
Dec. 4, 1996 [JP] Japan ..................................... 8-324118

[51] Int. Cl.$^7$ .................................................. H01S 3/085
[52] U.S. Cl. .............................................. 372/46; 257/79
[58] Field of Search ................................. 342/45, 46, 50; 257/79

[56] References Cited

U.S. PATENT DOCUMENTS

| | | | |
|---|---|---|---|
| 4,870,468 | 9/1989 | Kinoshita et al. | 357/17 |
| 4,870,469 | 9/1989 | Nishizawa et al. | 357/22 |
| 4,958,202 | 9/1990 | Kinoshita et al. | 357/17 |
| 5,021,361 | 6/1991 | Kinoshita et al. | 437/129 |

OTHER PUBLICATIONS

Y. Hirayama, et al., "High Speed 1.5 μm Self–Aligned Constricted Mesa DFB Lasers Grown Entirely by MOCVD," IEEE Journal of Quantum Electronics, vol. 25, No. 6, pp. 1320–1323, Jun., 1989.

*Primary Examiner*—James W. Davie
*Attorney, Agent, or Firm*—Finnegan, Henderson, Farabow, Garrett & Dunner, L.L.P.

[57] ABSTRACT

A burying-heterostructure (BH) type semiconductor laser having a constricted mesa which has an active region. The laser has two spaces, located above and below the active region, for constricting a current to reduce a leakage current. The laser further has a first group of columns extending through the space located above the active region, and a second group of columns extending through the space located below the space. The columns of the first group are staggered in a vertical plane, with respect to the columns of the second group.

37 Claims, 13 Drawing Sheets

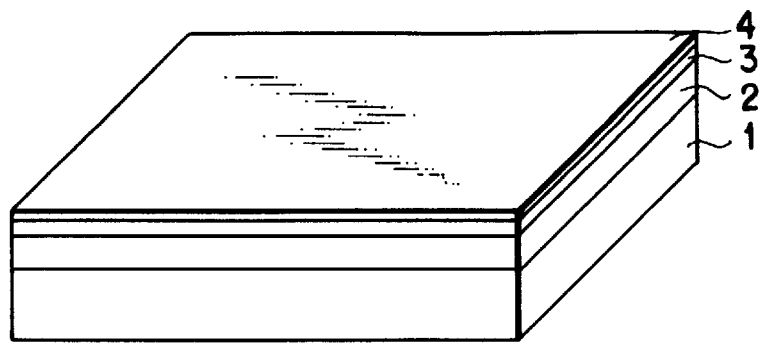
F I G. 10A
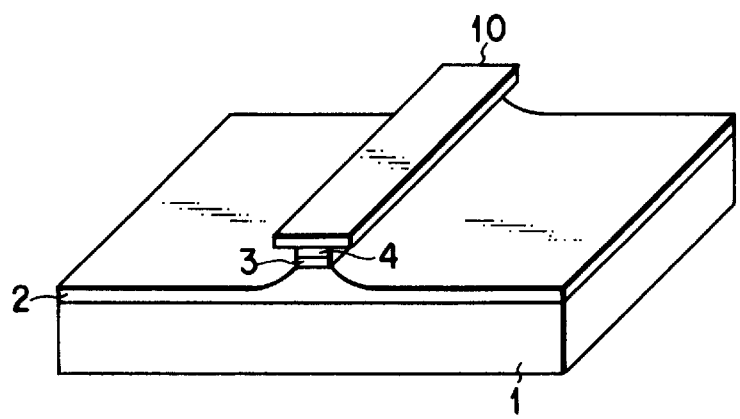
F I G. 10B
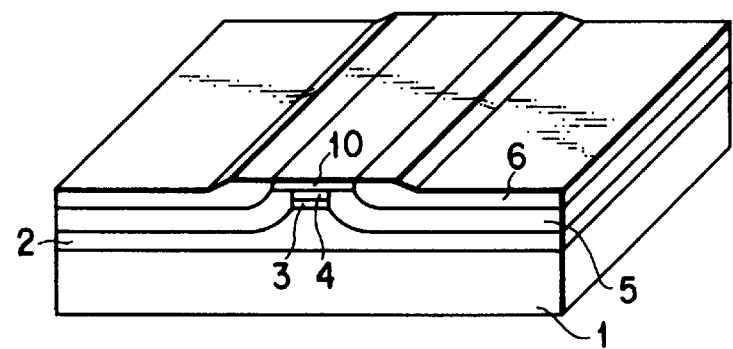
F I G. 10C
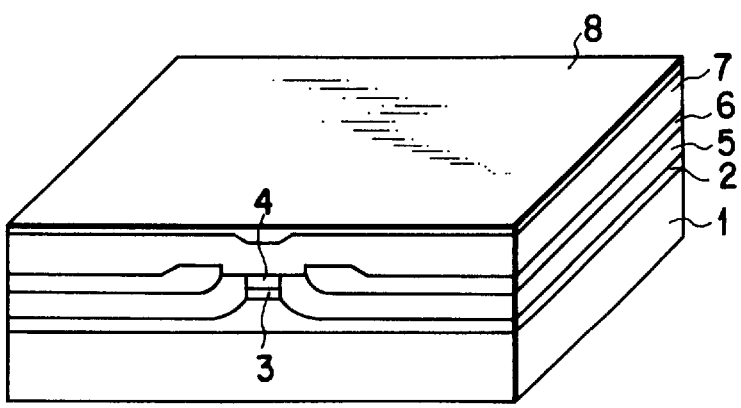
F I G. 10D

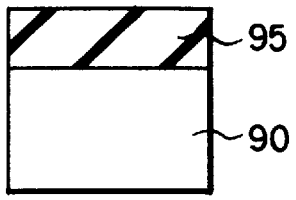
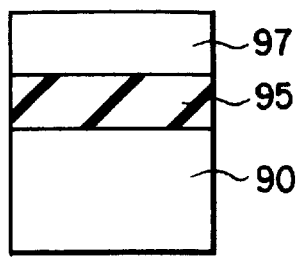
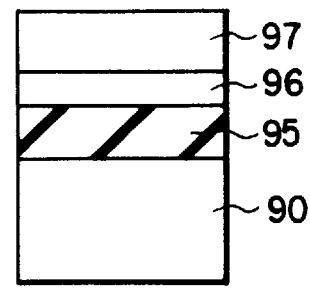
FIG. 12A     FIG. 12B     FIG. 12C
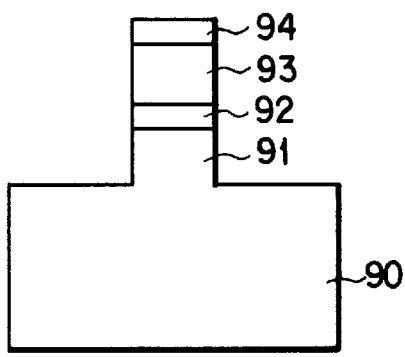
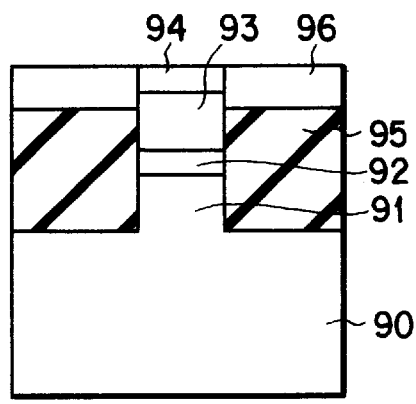
FIG. 13A     FIG. 13B
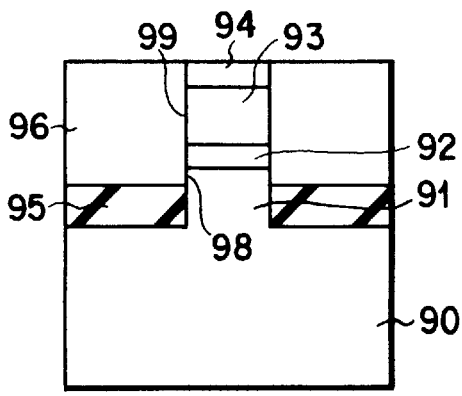
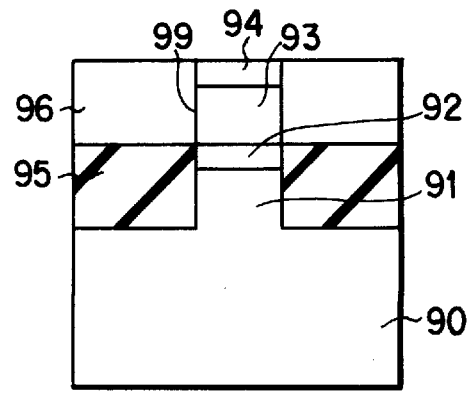
FIG. 13C     FIG. 13D

SEMICONDUCTOR DEVICE HAVING A CURRENT-CONSTRICTING SPACES AND METHOD OF MANUFACTURING THE DEVICE

BACKGROUND OF THE INVENTION

The present invention relates to a semiconductor device having current-constricting spaces and a method of manufacturing the semiconductor device, and more particularly to an improved, buried-heterostructure (BH) type semiconductor laser having a self-aligned constricted mesa.

Conventional InGaAsP/InP-based, BH-type semiconductor lasers and methods of manufacturing the lasers will be described below.

First, a method of manufacturing an InGaAsP BH laser, in which MOVPE (Metal Organic Vapor Phase Epitaxial) crystal growth method is utilized, will be explained with reference to FIGS. 10A to 10D.

First, as shown in FIG. 10A, an n-type InP buffer layer 2, an undoped InGaAsP active layer 3, and a p-type InP cladding layer 4 are successively grown by MOVPE growth method, on a (100) n-type InP substrate 1. A double heterostructure composed of the n-type InGaAsP layer 3 and p-type InP layer 4 is thereby formed. Next, as shown in FIG. 10B, an $SiO_2$ film 10 is deposited by CVD (Chemical Vapor Deposition) method on the p-type InP layer 4 and patterned, forming a stripe. Using the stripe of the $SiO_2$ film 10 as a mask, the p-type InP layer 4, undoped InGaAsP active layer 3 and n-type InP buffer layer 2 are etched, thereby forming a mesa stripe. Thus, the active layer 3 becomes a stripe.

As shown in FIG. 10C, a p-type InP burying layer 5 is formed by MOCVD method on the n-type InP buffer layer 2, on either side of the stripe-shaped active layer 3. Further, a p-type InP burying layer 6 is then formed by MOCVD method on the burying layer 5, on either side of the active layer 3.

Finally, as shown in FIG. 10D, the $SiO_2$ is removed, a p-type InP layer 7 is grown on all exposed layers, and a $p^+$-type InGaAsP ohmic contact layer 8 is grown on the p-type InP layer. As a result, an InGaAsP BH laser is manufactured.

To oscillate the laser (i.e. to emit a laser beam), the substrate 1 is connected to the ground and a positive voltage is applied to the ohmic contact layer 8. An electric current is thereby supplied to the layer 8. The current is blocked by the reverse bias junction formed at the interface between the burying layers 5 and 6. This is first-step current constriction. Residual currents leaking out of the first-step constriction mechanism are blocked by the InP forward junction constituted by the p-type InP burying layer 5 and the n-type InP buffer layer 2 as second-step of constriction. As a result, the current flows or concentrate focus onto the InGaAsP active layer 3. The second-step constriction is explained as follows. That is, since the built-in potential of an InGaAsP layer is lower than that of an InP layer, the current more easily flows at the InGaAsP forward junction than at the InP forward junction. The current is therefore constricted.

However, the current cannot be efficiently constricted when a high voltage is applied between the electrodes to obtain larger output power. This is because the difference between the built-in potentials of the InGaAsP and InP layers is not sufficient under highly-biased condition.

The p-type InP layer 7, the n-type InP burying layer 6, p-type InP burying layer 5 and n-type InP buffer layer 2 constitute a pnpn thyristor. The thyristor may turn on when a leakage current flowing from the InP burying layer 5 to the InP buffer layer 2 and acts as the gate current of the thyristor. In this case, the leakage current inevitably increases rapidly.

The parasitic capacitance C of the reverse bias junction between the p-type InP burying layer 5 and the n-type InP burying layer 6 limits the response frequency of the semiconductor laser. The laser can hardly be used in optical communication system at a rate of 10 Gbps or more. To reduce the parasitic capacitance C, the area of the reverse bias junction between the buried layers 5 and 6 must be reduced.

The leakage current characteristic of the buried-heterostructure laser shown in FIG. 10D depends on the thickness, carrier concentrations, shapes and the like of the p-type InP burying layer 5 and the n-type InP burying layer 6, both provided near the active layer 3. Hence, semiconductor lasers of this type may greatly differ in their characteristics.

Now, a method of manufacturing a semiconductor laser having an InGaAsP/InP self-aligned constricted mesa will be explained with reference to FIGS. 11A to 11E. The method is disclosed in, for example, U.S. Pat. No. 4,870, 469, U.S. Pat. No. 4,958,202, and Y. Hirayama et al., "High-speed 1.5 µm self-aligned constricted mesa DFB lasers grown entirely by MOCVD," IEEE Journal of Quantum Electronics, Vol. 25, pp. 1320–1323, 1989.

First, as shown in FIG. 11A, an n-type InP buffer layer 12, an undoped InGaAsP active layer 13, a p-type InP cladding layer 14 are successively grown on a (100) n-type InP substrate 11. A double heterostructure is thereby formed.

As shown in FIG. 11B, a resist (not shown) is coated on the InP cladding layer 14 and patterned so as to remove two elongated parts (having a width of 1 µm) of the active layer 13 in order to obtain a stripe-shaped active layer. Using the patterned resist as a mask, the p-type InP cladding layer 14, undoped InGaAsP active layer 13 and n-type InP buffer layer 12 are etched one after another. Two grooves 15 are thereby formed in these layers 12, 13 and 14, exposing two parts of the n-type InP substrate 11.

Then, as shown in FIG. 11C, a p-type InP layer 17 is formed on the exposed parts of the substrate 11 and also on the p-type InP layer 14. Further, a $p^+$-type InGaAsP ohmic contact layer 18 is grown on the p-type InP layer 17.

Thereafter, a resist (not shown) is coated on the ohmic contact layer 18 and patterned by means of photolithography so as to form two grooves in the layers 18, 17 and 14. Using the patterned resist as a mask, the InGaAsP layer 18 is etched to have two slits later. Using the layer 18 thus etched, as a mask, the p-type InP layers 17 and 14 are etched with HCl. Two grooves 19 are thereby formed in the layers 14, 17 and 18. Since HCl is a selective etchant, only the p-type InP layers 17 and 14 are etched, and the undoped InGaAsP active layer 13 is not etched at all. In other words, the etching automatically stops at the active layer 13. As a result, the structure shown in FIG. 11D is obtained. As seen from FIG. 11D, the structure has a mesa 20 which includes the stripe-shaped active layer and which is sufficiently broad, covering both grooves 15 made in the layers 12, 13 and 14.

Then, those parts of the undoped InGaAsP active layer 13 which are left outside the grooves 15 are etched away with a $H_2SO_4$-based etchant, which is a selective etchant which reacts with InGaAsP only, not with InP. The InP filling the grooves 15 function as etching stoppers, automatically stopping the etching. As a result, spaces 21 are formed outside the grooves 15 as illustrated in FIG. 11E. Finally, an insulating film (not shown) is deposited on the resultant structure and electrodes (not shown) are formed. Thus manufactured is a semiconductor laser having an InGaAsP/InP self-aligned constricted mesa is manufactured.

In this semiconductor laser, a leakage current flows in only the InP forward junction 22 just beside the stripe-shaped active layer 13 and having a small junction area.

A semi-insulating crystal layer may be grown, surrounding the mesa section of a semiconductor layer, as will be explained with reference to FIGS. 12A to 12C.

First, as shown in FIG. 12A, a semi-insulating InP burying layer 95 doped with Fe is grown by means of MOVPE crystal growth method on, for example, n-type InP substrate 90. The semi-insulating InP layer has a high resistance. If a p-type InP layer 97 doped with Zn is formed on the semi-insulating InP burying layer 95 as shown in FIG. 12B, mutual diffusion of Zn and Fe will take place and the InP burying layer 95 will no longer be semi-insulating. To prevent this, a thin n-type InP 96 is grown on the semi-insulating InP burying layer 95 as is illustrated in FIG. 12C. Finally, the p-type InP layer 97 is grown on the n-type InP layer 96.

In practice, a semi-insulating crystal layer is not grown on the entire surface of the substrate 90. Usually, a layer having an pn-junction is processed into a mesa-shaped layer, and a semi-insulating layer is formed, surrounding the mesa-shaped junction. The pn-junction performs the main function of the semiconductor device. On the other hand, the semi-insulating layer achieves electric isolation, reduces parasitic capacitance, constricts the current at the pn-junction, and makes flat the upper surface of the device.

A semiconductor device comprising a mesa section which has an pn-junction and a semi-insulating layer surrounding the mesa section is known. How this device is manufactured will be explained, with reference to FIGS. 13A to 13D.

At first, an n-type InP layer 91, an undoped InGaAsP active layer 92, a p-type InP layer 93 and a p$^+$-type InGaAsP ohmic contact layer 94 are successively grown on a (100) n-type InP substrate 90. Then, these layers 91 to 94 are etched, forming a mesa structure, as illustrated in FIG. 13A. This is a double heterostructure like the InGaAsP/InP self-aligned constricted mesa of the semiconductor laser shown in FIG. 10D.

Next, a semi-insulating InP burying layer 95 is formed on the substrate 90, covering the sides of the InGaAsP active layer 92, and an n-type InP layer 96 is formed on the semi-insulating InP burying layer 95.

If the semi-insulating InP burying layer 95 is thick, covering the sides of the n-type InP layer 91, undoped InGaAsP active layer 92 and p-type InP layer 93 as is shown in FIG. 13B, mutual diffusion will take place between the semi-insulating InP layer buried 95 and the p-type InP layer 93 and the InP burying layer 95 will no longer semi-insulating.

If the semi-insulating InP burying layer 95 is thin, just covering the sides of the n-type InP layer 91 but not the sides of the InGaAsP active layer 92, as is illustrated in FIG. 13C, the n-type InP layer 96 will contact the n-type InP buffer layer 91. In this case, an interface 98 is formed between two n-type layers 91 and 96. A current is likely to flow via this interface 98, bypassing the InGaAsP active layer 92. That is, the current cannot be constricted in the InGaAsP active layer 92. Further, a high voltage is likely to be applied to the pn-junction 99 between the n-type InP layer 96 and the p-type InP layer 93, because the interface 99 is located above the InGaAsP active layer 92. Consequently, the pn-junction becomes electrically conductive, thus forming a current bypass, after the semiconductor device oscillate. Since the vertical pn-junction 99 has a different facet orientation, from the epitaxial orientation the junction 99 will likely have defects, causing a current to leak through it.

To solve these problems, the semi-insulating InP burying layer 95 may deposited on the substrate 90 to such a thickness that its upper surface is flush with that of the InGaAsP active layer 92, thus completely covering the sides of the n-type InP buffer layer 91 and active layer 92, as is illustrated in FIG. 13D. In practice, however, it is very difficult to control the thickness of the semi-insulating InP burying layer 95 so precisely. Could it be controlled so, the pn-junction 99 is still likely to have defects, and a current may leak through the pn-junction 99.

Thus, it is impossible to constrict a current effectively in any semiconductor device wherein a pn-junction is covered with a semi-insulating crystal layer. From this viewpoint, the aforementioned self-aligned constricted mesa is more advantageous than a mesa surrounded by a semi-insulating crystal layer. The self-aligned constricted mesa has a very small capacitance because it has small junction area and has no reverse junction. It should therefore be used in a high-speed semiconductor device.

There is two problems with the self-aligned constricted mesa, however. First, the leakage current increases when a high voltage is applied to the forward junction. Second, the mesa is mechanically weak because a stress concentrates on the bottle-necked constricted section.

In a constricted mesa structure, connection between the electrode provided on the stripe-shaped mesa having a mushroom-shaped cross section and the bonding pads provided on the upper surfaces of the other mesa. The electrode on the mesa is spaced apart from the bonding pads by grooves. Here arises a problem. Metalization for electrical connection must be carried out be using a step-recoverage method or air-bridge method.

BRIEF SUMMARY OF THE INVENTION

The object of the present invention is to provide a semiconductor device which has a small junction capacitance and can therefore operate at high speed, which is simple in structure and easy to manufacture and excels in mechanical strength, in which only a small leakage current flows even when a high voltage is applied, and in which the leakage current bypassing the active layer is small, accomplishing a great electrical isolation of components.

To achieve the object of the invention, there is provided a semiconductor device which comprises: a semiconductor substrate of a first conductivity type; a first cladding layer of the first conductivity type provided on the semiconductor substrate; an active layer provided on the first cladding layer; a second cladding layer of a second conductivity type provided on the active layer; a burying layer covering the active layer; a first space provided outside the burying layer and above the first cladding layer; a first semiconductor layer provided above the first space; a second space provided above the first semi-conductor layer; and a second semiconductor layer provided above the second space.

To achieve the object the invention, there is provided a method of manufacturing a semiconductor device, which comprises the steps of: crystal-growth of a first cladding layer of a first conductivity type, an active layer and a second cladding layer of a second conductivity type on a semiconductor substrate of the first conductivity type, in the order mentioned; crystal-growing a first semiconductor layer on the second cladding layer; etching the first semiconductor layer, the second cladding layer and the active layer in the order mentioned, thereby forming grooves on both sides of those parts of the first semiconductor layer, second cladding layer and active layer which will form a stripe-shaped active region; crystal-growth of a second semiconductor layer in the grooves and on the first semiconductor layer, thereby forming a burying layer in the grooves; etching the second semiconductor layer, the first semiconductor layer, the second cladding layer and the active layer in the order mentioned, thereby forming a mesa structure; and etching the first semiconductor layer and the active layer with a selective etchant, thereby forming first and second spaces. The mesa structure comprises the stripe-shaped active region and the burying layer, and the selective etching can etch the first semiconductor layer and the active layer and cannot etch the second semiconductor layer.

Additional objects advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 10A to 10D are perspective views explaining a method of manufacturing a conventional buried-heterostructure semiconductor laser;

FIGS. 12A to 12C are cross sectional views explaining mutual diffusion in a semi-insulating crystal layer; and FIGS. 13A to 13D are cross sectional views explaining the problems accompanying a pn-junction of double heterostructure, surrounded by a semi-insulating crystal layer.

DETAILED DESCRIPTION OF THE INVENTION

Embodiments of the invention will be described, with reference to the accompanying drawing.

With reference to FIGS. 1A to 1F, it will be explained how the first embodiment is manufactured.

Figure 1A:
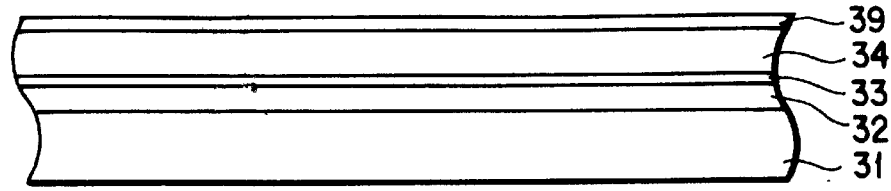
FIGS. 1A to 1F are sectional views explaining a method of manufacturing a first embodiment of the present invention.

First, as shown in FIG. 1A, an n-type InP buffer layer 32, an undoped InGaAsP active layer 22, a p-type InP cladding layer 34 and a p-type InGaAsP layer 35 are successively formed by MOVPE method on a (100) n-type InP substrate 31. The buffer layer 32 is 0.1 to 0.2 $\mu$m thick. The cladding layer 34 is about 1.3 to 1.5 $\mu$m thick. The p-type InGaAsP layer 39 is 0.1 to 0.2 $\mu$m thick. The p-type InP cladding layer 34 is thicker than its counterpart of the conventional self-aligned constricted mesa.

Figure 1B:
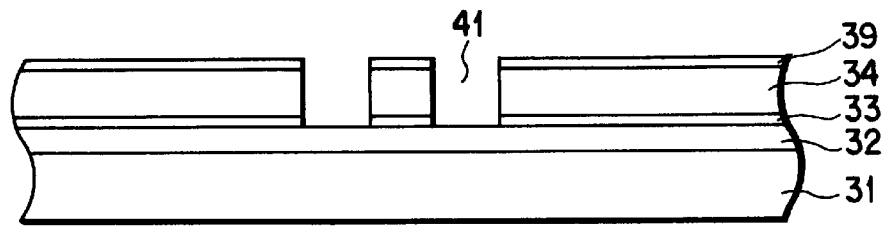

Then, a resist (not shown) is coated on the p-type InGaAsP layer 39. Two stripe-shaped openings, spaced apart by 1 $\mu$m and each having a width of about 1 $\mu$m, are made in the resist by means of photolithography. Using the resist as a mask, the p-type InGaAsP layer 39 is etched. Using the layer 39 thus etched, the p-type InP cladding layer 34 is etched with HCl-based etchant. Further, the InGaAsP active layer 33 is etched with $H_2SO_4$-based etchant, by using the cladding layer 34 as a mask. As shown in FIG. 1B, two grooves 41 are thereby made in the layers 33, 34 and 39. As a result, a strip-shaped active layer is formed which has a width of about 1 $\mu$m.

Figure 1C:
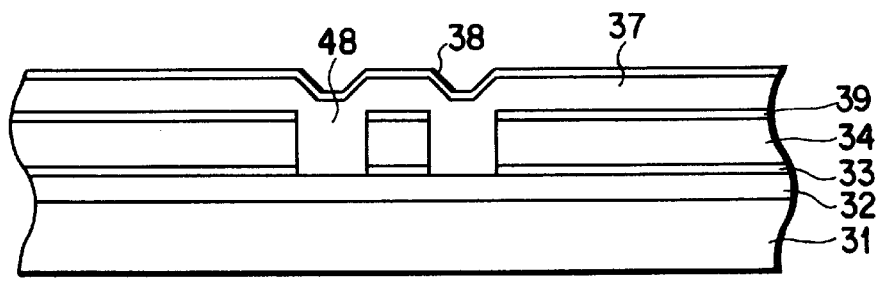

Next, a p-type InP layer 37 is grown by MOVPE method, covering the exposed parts of the n-type InP buffer layer 32 and the InGaAsP layer 39. A $p^+$-type InGaAsP ohmic contact layer 38 is grown on the p-type InP layer 37. A burying layer 48 is thereby formed, filling both grooves 41, as is illustrated in FIG. 1C.

Then, an electrode 40 having a width of about 5 $\mu$m is formed on the $p^+$-type InGaAsP layer 38 above the strip-shaped active layer.

Figure 1D:
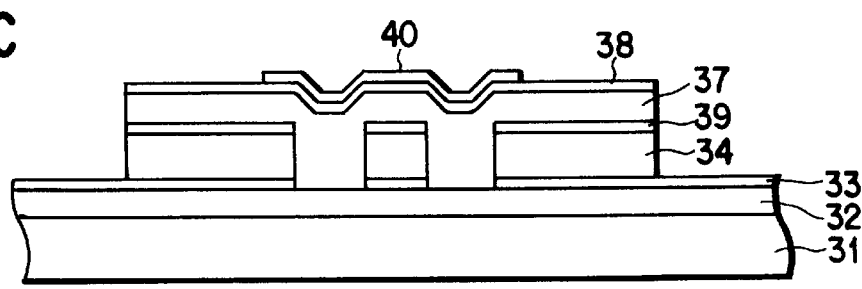

Thereafter, a resist (not shown) is coated on the $p^+$-type InGaAsP ohmic contact layer 38 and patterned by photolithography, in order to form a broad mesa which includes the stripe-shaped active layer and those parts of the InP layer 37 which fill the grooves 41. More precisely, the resist is so patterned that the broad mesa may have edges at a distance of, for example, 20 $\mu$m from the grooves 41. The $p^+$-type InGaAsP ohmic contact layer 38 is etched. Using the layer 38 as a mask, the p-type InP layer 37 is then etched with HCl-based etchant. Further, the p-type InGaAsP layer 39 is etched with $H_2SO_4$-based etchant. Finally, the p-type InP cladding layer 34 is etched with HCl-based etchant. A broad mesa 47 is thereby formed. An electrode 40 is formed on the $p^+$-type InGaAsP ohmic contact layer 38. As a result, the structure shown in FIG. 1D is obtained.

Figure 1E:
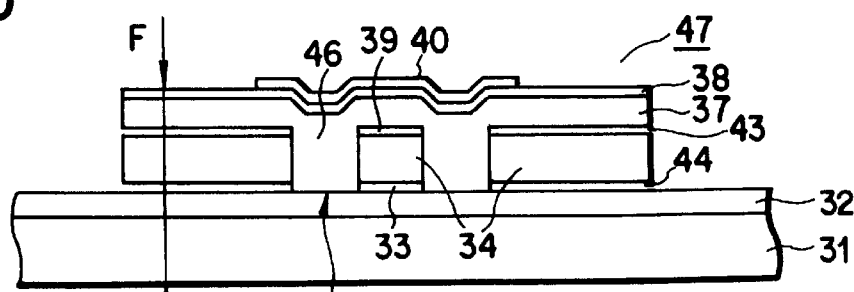
Figure 1F:
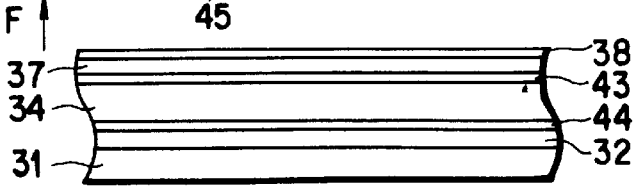

Those parts of the p-type InGaAsP layer 39 and undoped InGaAsP active layer 33 which exist between either groove 41 and either edge of the broad mesa 47 are etched away with $H_2SO_4$-based etchant, as is illustrated in FIG. 1E. The etching of the layers 39 and 33 automatically stops at the grooves 41 since those parts of the InP layer 37 which fill the grooves 41 act as etching stoppers. FIG. 1F is a sectional view, taken along line F—F shown in FIG. 1E.

Spaces 43 are formed between the layers 34 and 37, and spaces 44 are formed between the buffer layer 32 and the cladding layer 34.

As seen from FIG. 1E, a narrow InP forward junction 45 is provided by the side of the stripe-shaped active layer 33, and a narrow current path (bottle-neck) 46 (i.e., current-constricting mechanism) is provided above the junction 45, spaced therefrom by 1 μm. Hence, the broad mesa 47 is so to mention a double constricted mesa.

Provided with the bottle-neck 46, the double constricted mesa 47 has a high resistance. Therefore, the leakage current flowing from the electrode 40 to the substrate 31 is minimized. However, the double constricted mesa 47 is mechanically less strong than the conventional self-aligned constricted mesa shown in FIG. 11.

A second embodiment of the invention will be described. The second embodiment has a double constricted mesa having spaces, too. The second embodiment is characterized in that at least one column extends through the space, increasing the strength of the double constricted mesa. How the second embodiment is manufactured will be explained, with reference to FIGS. 2A to 2F.

Figure 2A:
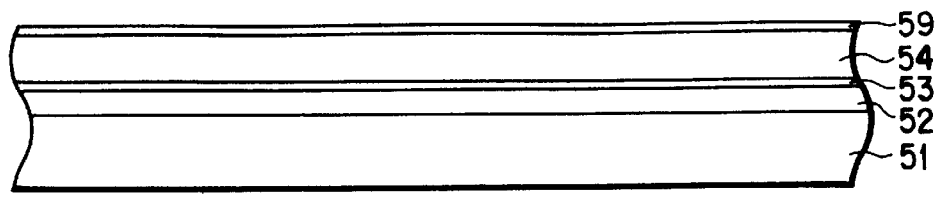
FIGS. 2A to 2F are sectional views explaining a method of manufacturing a second embodiment of the invention.

First, as shown in FIG. 2A, an n-type InP buffer layer 52, an undoped InGaAsP active layer 53, a p-type InP cladding layer 54, and a p-type InGaAsP layer 59 are successively grown by MOVPE method on a (100) n-type InP substrate 51. The undoped InGaAsP active layer 53 is 0.1 to 0.2 μm thick, the p-type InP cladding layer 54 is, for example, 1 μm thick. The p-type InGaAsP layer 59 is 0.1 to 0.2 μm thick. A double heterostructure is thereby formed.

Figure 2B:
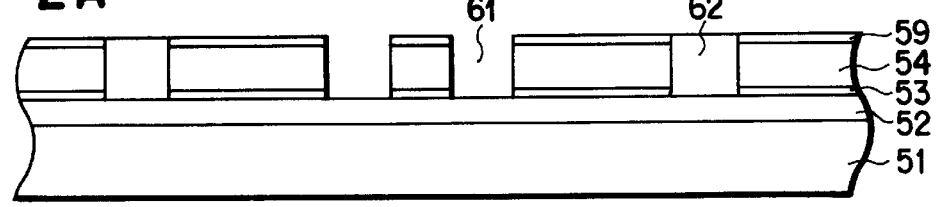

Next, a resist (not shown) is coated on the p-type InGaAsP layer 59. The resist is patterned by means of photolithography, forming two stripe-shaped openings and at least one opening in the resist. The two stripe-shaped openings have a width of about 1 μm and spaced apart by 1 μm, in order to form a stripe-shaped active layer which has a width of, for example, 1 μm. The other opening is located on one edge portion of a mesa which will be formed later. Using the resist as a mask, the p-type InGaAsP layer 59 is etched. The resist is removed from the p-type InGaAsP layer 59. Then, the p-type InP cladding layer 54 is etched with HCl-based etchant by using, the layer 59 as a mask. Further, the InGaAsP active layer 53 is etched with $H_2SO_4$-based etchant, while using the layer 54 as a mask. As a result, groves 61 and at least one opening 62 are made in the layers 53, 54 and 59 as is shown in FIG. 2B.

Figure 2C:
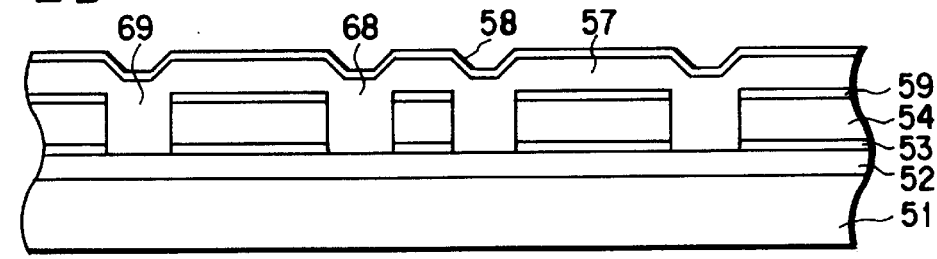

Then, a p-type InP layer 57 is grown by MOVPE method, filling the grooves 61 and the opening 62 and covering the p-type InGaAsP layer 59. A p⁺-type InGaAsP ohmic contact layer 58 is grown on the p-type InP layer 57 by means of MOCVD method. Two stripe-shaped burying layers 68 made of p-type InP are thereby formed on the sides of a stripe-shaped active layer 53, and at least one column 69 made of p-type InP is formed outside one of the burying layers 68, as is illustrated in FIG. 2C. Further, an electrode 60 having a width of about 5 μm is formed on the p⁺-type InGaAsP ohmic contact layer 58 and located right above the stripe-shaped active layer 53.

Figure 2D:
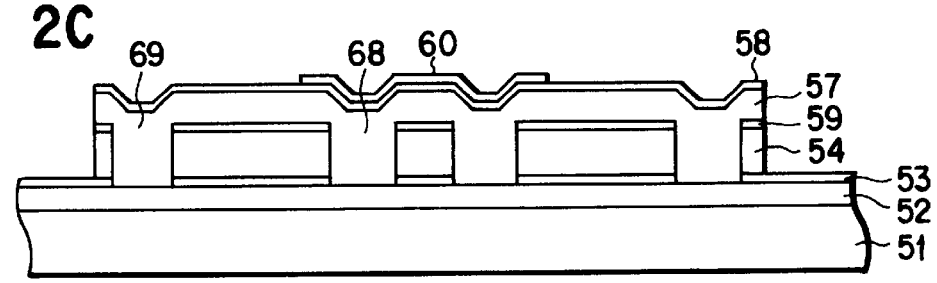

Thereafter, a resist (not shown) is coated on the p⁺-type InGaAsP layer 58. The resist is patterned in order to form a broad mesa which includes the stripe-shaped active layer 53, the burying layers 68 and the column 69. More precisely, the resist is so patterned that the broad mesa may have edges at a distance of, for example, 20 μm from the two burying layers 68. Using the resist as a mask, the p⁺-type InGaAsP ohmic contact layer 58 is etched. Using the layer 58, as a mask, the p-type InP layer 57 is etched with HCl-based etchant. Further, the p-type InGaAsP layer 59 is etched with $H_2SO_4$-based etchant. Finally, the p-type InP cladding layer 54 is etched with HCl-based etchant. As a result, the structure shown in FIG. 2D is obtained.

Figure 2E:
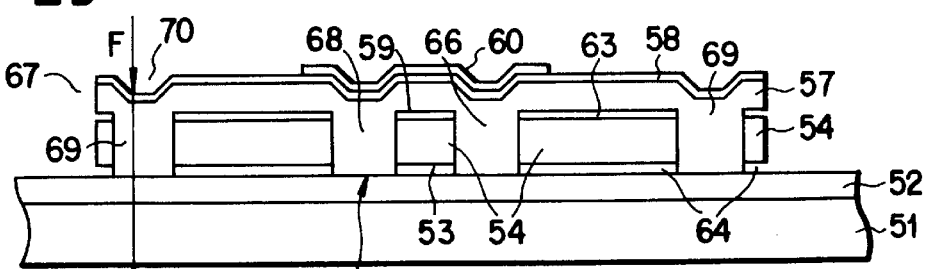

Then, those portions of the p-type InGaAsP layer 59 which are sandwiched between the cladding layer 54 and the p-type InP layer 57 are etched away with $H_2SO_4$-based etchant, thereby forming spaces 63. Similarly, those portions of the stripe-shaped active layer 53 which are sandwiched between the n-type InP buffer layer 52 and the p-type InP cladding layer 54 are etched away with $H_2SO_4$-based etchant, thereby forming spaces 64. The burying layers 68 filling the grooves 61 and the InP column 69 filling the opening 62 serve as etching stoppers. Hence, a narrow InP forward junction 65 is provided by the side of the stripe-shaped active layer 53, and a bottle-necked narrow passage 66 (i.e., current-constricting mechanism) is provided above the junction 65, spaced therefrom by 1 μm, in the same way as in the first embodiment. A mesa 67 is thereby formed as shown in FIG. 2E. This is a double constricted mesa.

Figure 2F:
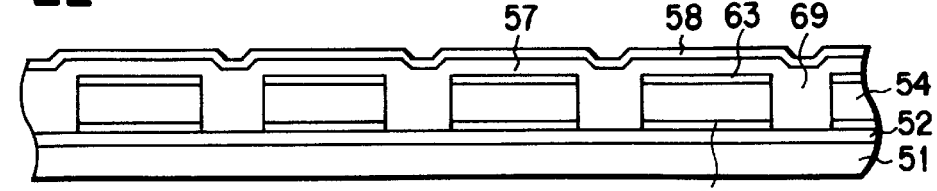

FIG. 2F is a cross-sectional view, taken along the line F—F shown in FIG. 2E. As seen from FIGS. 2E and 2F, the InP column 69 extends through the spaces 63 and 64, in the edge section of the mesa 67. The InP column 69 renders the double constricted mesa 67 mechanically strong.

The mesa 67 is much broader than the electrode 60. The electrode 60 is located above the stripe-shaped active layer 53, the burying layers 68, and that edge portion of the p-type InP layer 57 which surrounds the layers 68, not located above the column 69. The p-type InP layer 57 interposed between the electrode 60 and the column 69 has a higher resistance than n-type InP, not only because it is thin but also p-type InP has a high specific resistance. Therefore, only a small leakage current flows from the electrode 60 through the column 69 to the substrate 51.

The second embodiment has some problems, however. It is not possible to prevent a current from leaking from the electrode 60 to the substrate 51. Further, recesses 70 are formed in the surface of the p-type InP layer 57, inevitably because the grooves 61 and the opening 62 are relatively deep. When the conductive layer is selectively etched to form the electrode 60, some parts of the conductive layer may remain unetched in the recesses 70.

A third embodiment of the present invention will be described. The third embodiment has been designed to eliminate the above-mentioned drawback of the second embodiment. How the third embodiment is manufactured will be explained, with reference to FIGS. 3A to 3G.

Figure 3A:
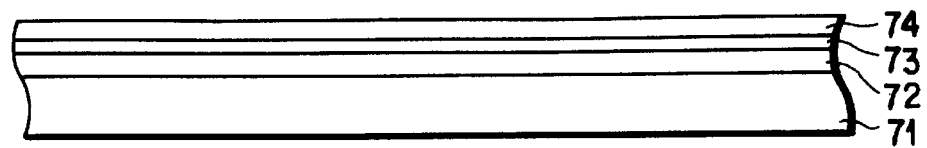
FIGS. 3A to 3G are sectional views explaining a method of manufacturing a third embodiment of this invention.

As shown in FIG. 3A, an n-type InP buffer layer 72, an undoped InGaAsP active layer 73, and a first p-type InP cladding layer 74 are successively grown by MOCVD method on a (100) n-type InP substrate 71. A double heterostructure is thereby formed. The buffer layer 72 is, for example, 0.1 to 0.2 μm thick. The cladding layer 74 is 0.5 μm or less thick, as in the conventional self-aligned constricted mesa.

Then, a resist (not shown) is coated on the first p-type InP cladding layer 74. The resist is patterned by photolithography, forming two stripe-shaped openings and at least one opening in the resist. The stripe-shaped openings have a width of about 1 μm, for forming an active layer which has a width of, for example, 1 μm. The other opening is located on one edge portion of a mesa which will be formed later. Using the resist as a mask, the first InP cladding layer 74 is etched with HCl-based etchant, and the InGaAsP active layer 73 is etched with $H_2SO_4$-based etchant. Two grooves 81 and one opening 82 are thereby made in the first cladding layer 74 and the active layer 73 as shown in FIG.

Figure 3B:
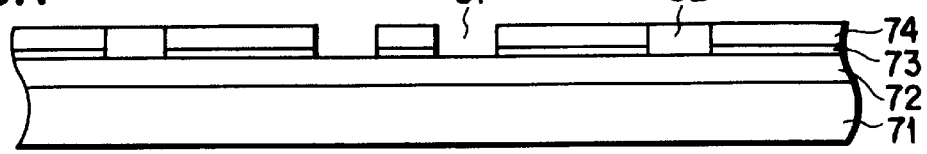

3B. As a result of this, a stripe-shaped active layer is formed, located between the grooves 81 as is shown in FIG. 3B.

Figure 3C:
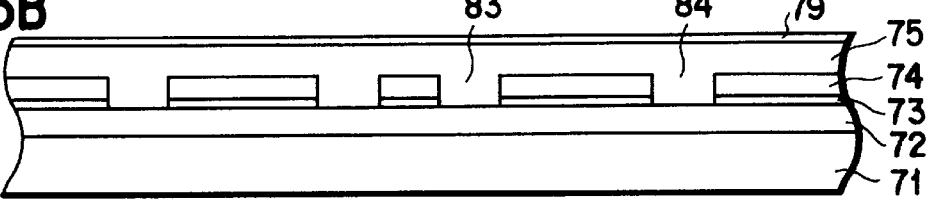

Next, as shown in FIG. 3C, a second p-type InP cladding layer 75 is grown, filling the grooves 81 and the opening 82 and covering the first p-type InP cladding layer 74. A p-type InGaAsP layer 79, 0.1 to 0.2 μm thick, is grown by MOVPE method on the second InP cladding layer 75. Burying layers 83 made of InP are thereby formed in the grooves 81, and a column 84 made of InP is formed in the opening 82. The grooves 81 and the opening 82 are less deep than their counter-parts of the first and second embodiments. Therefore, the second InP cladding layer 75 has a relatively flat upper surface, and so does the p-type InGaAsP layer 79, as is seen from FIG. 3C.

Figure 3D:
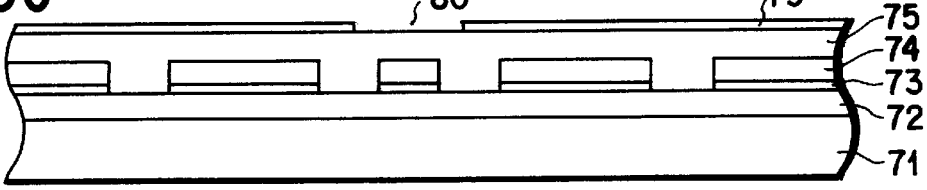

A resist (not shown) is coated on the p-type InGaAsP layer 79 and patterned by photolithography, forming a stripe-shaped opening in the resist. Using the resist as a mask, the p-type InGaAsP layer 79 is etched. A stripe-shaped opening 80 is thereby made in the layer 79, located right above the stripe-shaped active layer 73, as illustrated in FIG. 3D. Further, an opening (not shown) is made in any part of the layer 79 which is not located right above the column 84.

Figure 3E:
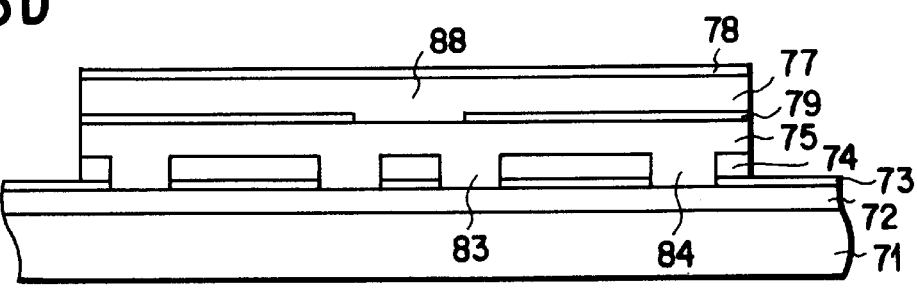

Then, as shown in FIG. 3E, a p-type InP layer 77, about 1 μm thick, is grown by MOVPE method on the p-type InGaAsP layer 79, filling the stripe-shaped opening 80. A p$^+$-type InGaAsP ohmic contact layer 78 is grown by MOVPE method on the p-type InP layer 77. The InP layer 77 contacts the second InP cladding layer 75, at the portion filled in the opening 80. A column (not shown) made of InP is formed, contacting the second InP cladding layer 75 and not located above the column 84.

A resist (not shown) is coated on the p$^+$-type InGaAsP ohmic contact layer 78 and so patterned to form a broad mesa which includes both burying layers 83 and the column 84. More precisely, the resist is so patterned that the broad mesa may have edges at a distance of, for example, 20 μm from the two burying layers 83. Using the resist as a mask, the p$^+$-type InGaAsP ohmic contact layer 78 is etched with H$_2$SO$_4$-based etchant. Using the layer 78, thus etched, as a mask, the p-type InP layer 77 is etched with HCl-based etchant. Further, the p-type InGaAsP layer 79 is etched with H$_2$SO$_4$-based etchant. Finally, the second p-type InP cladding layer 75 and the first p-type InP cladding layer 74 are etched with HCl-based etchant. As a result, the structure shown in FIG. 3E is obtained.

Figure 3F:
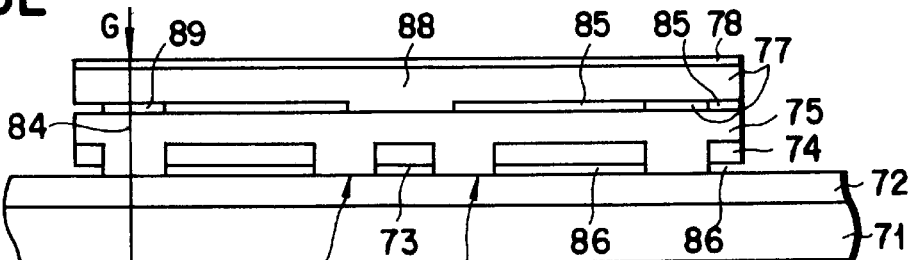

H$_2$SO$_4$-based etchant is applied from the edges of the broad mesa. Those parts of the active layer 73 which exist outside the columns 84 are thereby etched away. At the same time, the p-type InGaAsP layer 79 interposed between the p-type InP layer 77 and the second cladding layer 75 is etched away. Since H$_2$SO$_4$-based etchant is a selective etchant which reacts with InGaAsP only, not with InP, as indicated above, the InP layers 83 filling the grooves 81 and the InP layer 77 filling the opening 80 function as etching stoppers, automatically terminating the etching. As a result, spaces 85 and 86 are formed, as is illustrated in FIG. 3F. As shown in FIG. 3F, a narrow InP forward junction area 87 is provided on either side of the stripe-shaped active layer 73, and a narrow passage 88 with a bottle-necked cross-section (i.e., current-constricting mechanism) is provided above the junction 78, spaced therefrom by 1 μm, in the same way as in the first embodiment. A double constricted mesa is thus formed.

Figure 3G:
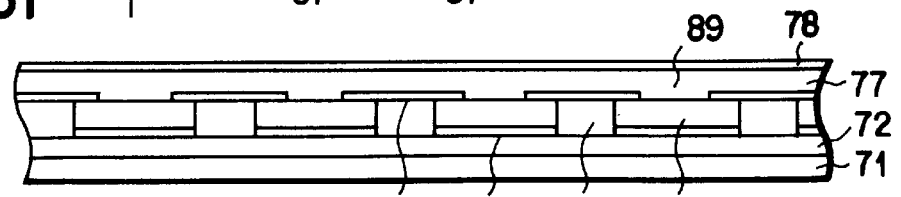

FIG. 3G is a sectional view, taken along line G—G in FIG. 3F. As seen from FIG. 3G, lower columns 84 and upper column 59 are flexibly arranged. Since the columns 84 and 89 are so arranged, a part of the first p-type InP cladding layer 74 existing between each lower column 84 and the nearest upper column 89 is relatively long. Hence, the resistance between these columns 84 and 89 is high, reducing the leakage current still more than is possible in the second embodiment.

In addition, the second InP cladding layer 75 has a relatively flat upper surface, and the p-type InGaAsP layer 79 has therefore a relatively flat upper surface. This is because the grooves 81 are less deep than their counterparts of the second embodiment and can be filled by means of MOVPE crystal growth method more easily than in the second embodiment.

With the first to third embodiments it is possible to fill up the spaces with insulating substance such as SiNx by performing plasma CVD on the sides of the broad mesa. If the spaces is thus filled, the double constricted mesa 67 will become mechanically stronger.

A fourth embodiment of the present invention will be described. The fourth embodiment is an InGaAsP/InP semiconductor laser which comprises an n-type InP substrate and a self-aligned constricted mesa. How the fourth embodiment is manufactured will be explained, with reference to FIGS. 4A to 4F.

Figure 4A:
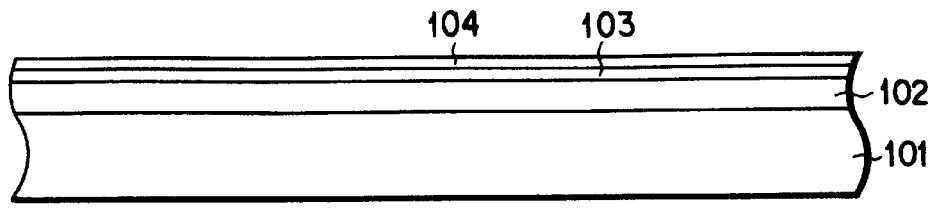
FIGS. 4A to 4F are sectional views explaining a method of manufacturing a fourth embodiment of the invention.
Figure 4B:
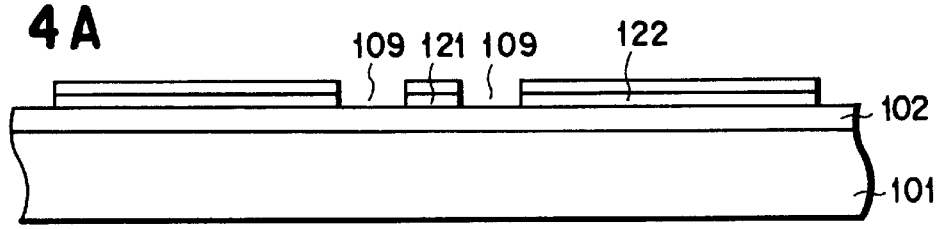
Figure 5:
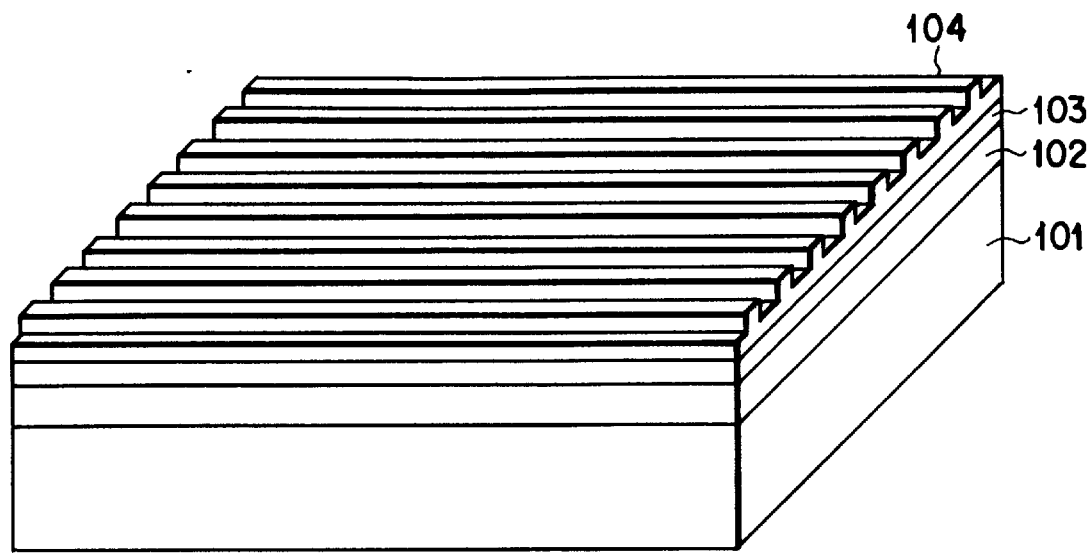
FIG. 5 is a perspective view of the diffraction grating incorporated in the fourth embodiment.

At first, as shown in FIG. 4A, an n-type InP buffer layer 102, an undoped InGaAsP active layer 103 and an undoped or n-type InGaAsP layer 104 are successively formed on a (100) InP substrate 101 by MOVPE method. A double heterostructure is thereby obtained. To manufacture a DFB laser, a number of narrow grooves are cut in the upper surface of the InGaAsP layer 104 as shown in FIG. 5, thus providing a diffraction grating. The grooves extend parallel to one another, in direction perpendicular to a stripe direction of the active layer which will be formed later.

Next, a resist (not shown) is coated on the InGaAsP layer 104. The resist is patterned by photolithography, forming two stripe-shaped openings in the rests. The stripe-shaped openings have a width of about 1 μm, for forming a stripe-shaped active layer which has a width of, for example, 1 μm. Two other openings are made in the resist, for forming two active layers on both sides of the stripe-shaped active layer, which have a width of about 10 μm. Using the resist thus pattern, as an etching mask, the InGaAsP layer 104 and the InGaAsP active layer 103 are selectively etched, forming two grooves 109 in the layers 104 and 103. As a result, spaces can be provided which are not opened but semi-closed. The spaces will be defined by bridge-shaped structure, each having two supports. The InGaAsP/InP semiconductor laser can therefore be mechanically strong.

Figure 4C:
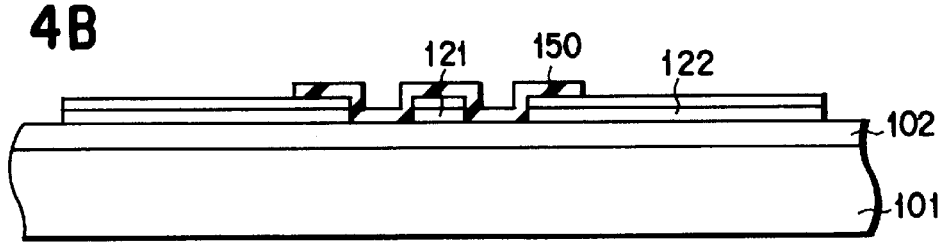

A thin SiO$_2$ film is deposited on the InGaAsP layer 104, filling the grooves 19 and covering the exposed parts of the n-type InP buffer layer 102. A resist (not shown) is coated on the upper surface of the resultant structure. The resist is pattern by means of photolithography, forming a stripe-shaped opening in this resist. The stripe-shaped opening is located above the stripe-shaped active layer 121, both grooves 109 and parts of the active regions 122. Using the resist as a mask, the SiO$_2$ film is selectively etched, forming a stripe-shaped SiO$_2$ film 150 as shown in FIG. 4C. The film 150 fills both grooves 106 and covers the stripe-shaped active layer 121 and a part of the active regions 122.

Figure 4D:
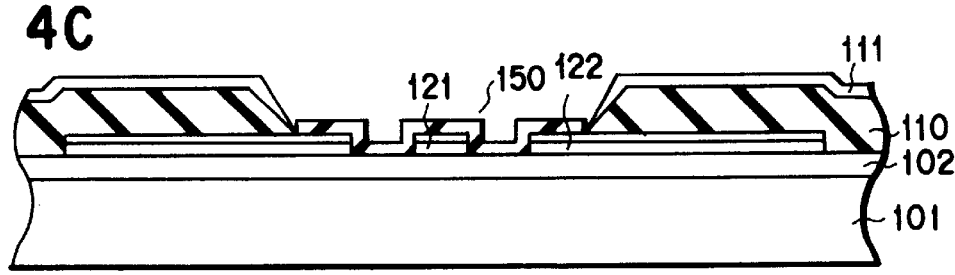

Thereafter, using the stripe-shaped SiO$_2$ film 150 as a mask, a semi-insulating InP layer 110 is grown on the n-type InP buffer layer 102 and on the undoped InGaAsP layer 104 as is illustrated in FIG. 4D. Then, an n-type InP film 111 is grown on the semi-insulating InP layer 110 to prevent mutual diffusion of impurities. As shown in FIG. 4D, the inner sides of the layers 110 and 111 are inclined.

Figure 4E:
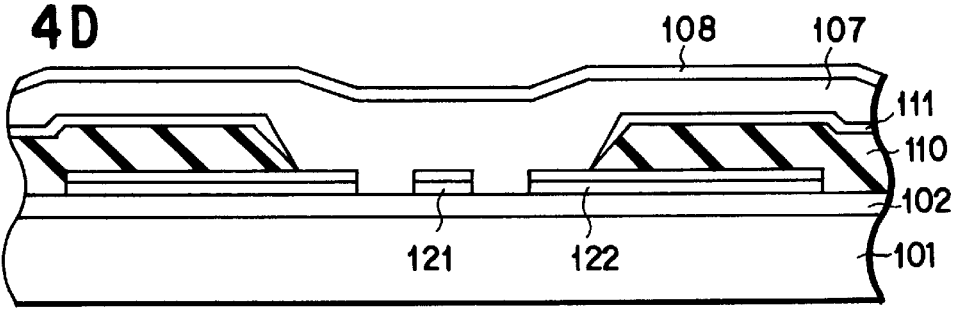

The $SiO_2$ film 150 is removed. A p-type InP layer 107 is grown all over the layers as shown in FIG. 4E. Further, a $p^+$-type InGaAsP ohmic contact layer 108 is grown on the p-type InP layer 107.

Next, two holes 160 are made in the layers 108, 107, 111 and 110, reaching the active regions 122, respectively. To be more specific, a resist (not shown) is formed on the InGaAsP ohmic contact layer 108 and patterned, forming two openings which is located above the active regions 122. Using the resist as a mask, the InGaAsP ohmic contact layer 108 is selectively etched with $H_2SO_4+H_2O+H_2O$-based etchant. This etchant is a selective one which with InGaAsP only, not with InP. Using the InGaAsP ohmic contact layer 108 as a mask, HCl-base etchant is applied. The InGaAsP layers are not etched at all, whereas the InP layers 107, 111 and 110 are selectively etched. The etching automatically stops at the undoped InGaAsP layer 104 which are located outside the grooves 109. Thus, the holes 160 are made, reaching the undoped InGaAsP layers 104.

Thereafter, $H_2SO_4+H_2O+H_2O$-based etchant is applied through the holes 160, etching away the undoped InGaAsP active layers 103 and undoped InGaAsP layers 104 which are located outside the grooves 109. As a result, spaces 170 are provided as shown in FIG. 4F.

Those portions of the p-type InP layer 107 which fills the grooves 109 serve as etching stoppers. Hence, neither the stripe-shaped active layer 121 nor the InGaAsP layer 104 provided on the layer 121 is not etched at all. Hence, two narrow InP forward junctions 130 are formed on both sides of the stripe-shaped active layer 121. The forward junctions 130 are flush with the lower surface of the stripe-shaped active layer 121, i.e., the (100) face. The leakage current flows through the junctions 130 but in a very small amount. This increases the reliability of the InGaAsP/InP semiconductor laser.

Figure 4F:
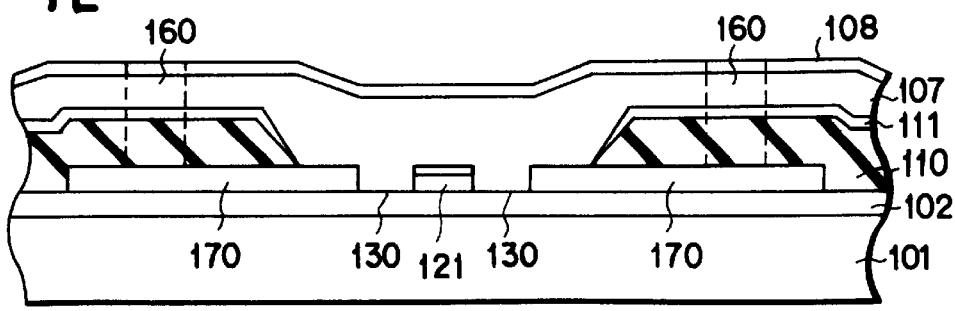

As can be understood from FIG. 4F, the semi-insulating layers 110 has no part that contacts the p-type InP layer 107. Nor do the n-type InP layers contact one another. Nor do the p-type InP layers contact one another. The n-type InP layer 111 is spaced apart from the undoped or n-type InGaAsP layer 104, thanks to the spaces 170.

Since the n-type InP layer 111 covers the semi-insulating layers 110, no mutual diffusion of impurities occurs in the semi-insulating layers 110. The layer 110 would not lose its electrical insulating property. Moreover, no junctions are formed that will make it difficult to constrict the current flowing to the stripe-shaped active layer 121.

The semi-insulating layers 110 contacts the InP substrate 101 at a position outside the spaces 170. The spaces 170 are not opened but semi-closed. Each space 170 is defined by bridge-shaped structure, each having two supports which are that portion of the layer 107 which fills the groove 109 and that portion of the semi-insulating layer 110 which contacts the InP substrate 101. The self-aligned constricted mesa of the fourth embodiment is therefore be mechanically stronger than the conventional self-aligned constricted mesa.

Each etching holes (slits) 160 is not so long along the stripe-shaped layer 121. In other words, metalization connecting the active region and the bonding pad can be formed co-planarly. Thus, it facilitates manufacturing because the step-recoverage technique or air-bridge metalization are no longer necessary.

The InGaAsP ohmic contact layer 108 and those parts of the p-type InP layer 107 which surround the spaces 170 may be removed. If this is the case, the InGaAsP/InP semiconductor laser can be electrically isolated from any other device that is integrated monolithically on the same InP substrate 101.

A fifth embodiment of this invention will be described. The fifth embodiment has more spaces than the fourth embodiment. It will be explained how the fourth embodiment is manufactured, with reference to FIGS. 6A to 6F.

Figure 6A:
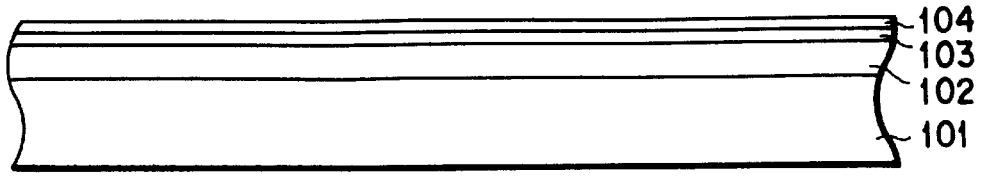
FIGS. 6A to 6F are sectional views explaining a method of manufacturing a fifth embodiment of the present invention.
Figure 6B:
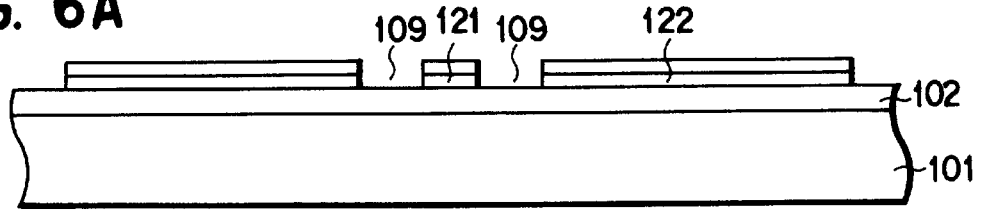
Figure 6C:
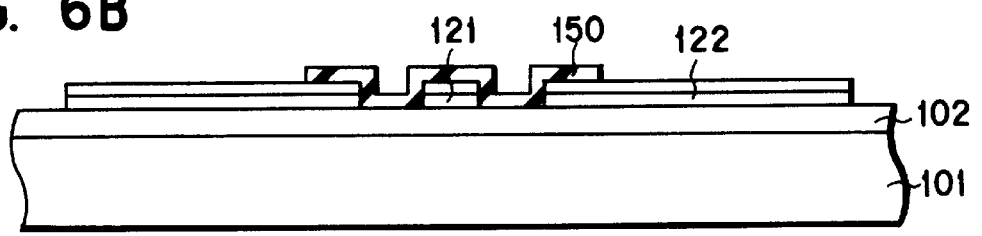

The same steps are performed as in manufacturing the fourth embodiment until a stripe-shaped $SiO_2$ film 150 as is shown in FIG. 6C. Thus, FIGS. 6A to 6C are identical to FIGS. 4A to 4C, respectively.

Figure 6D:
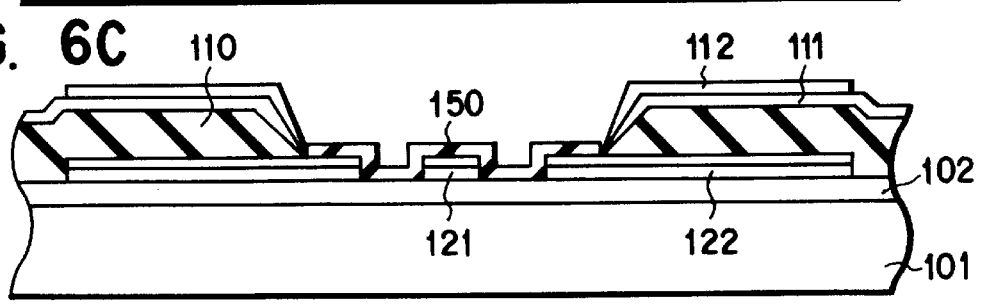

Then, using the stripe-shaped $SiO_2$ film 150 as a mask, a semi-insulating InP layer 110 and an n-type InP layer 111 are successively grown on the exposed parts of the n-type InP buffer layer 102 and the undoped InGaAsP layer 104 as is illustrated in FIG. 6D. The n-type InP layer 111 is provided for preventing mutual diffusion of impurities. An InGaAsP layer 112 is grown on the n-type InP layer 111. Because of their growth depending on facets, the layers 110, 111 and 112 have inner sides inclined to the substrate 101. The InGaAsP layer 112 is removed, except that part located above the active regions 122.

Figure 6E:
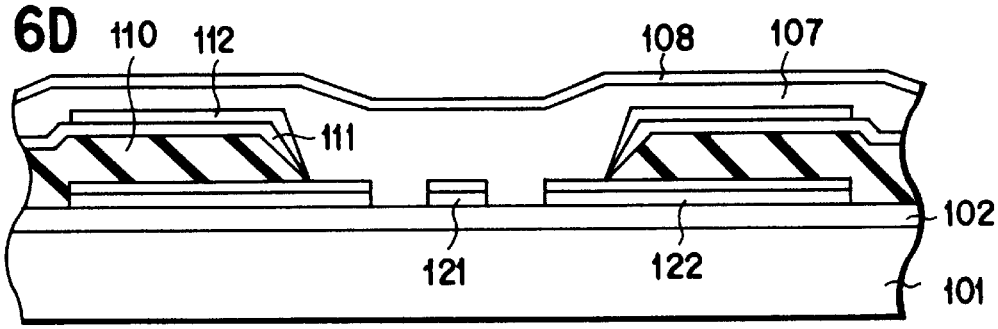

The $SiO_2$ film 150 is removed. A p-type InP layer 107 is grown all over the layer as shown in FIG. 6E. Further, a $p^+$-type InGaAsP ohmic contact layer 108 is grown on the p-type InP layer 107.

Figure 6F:
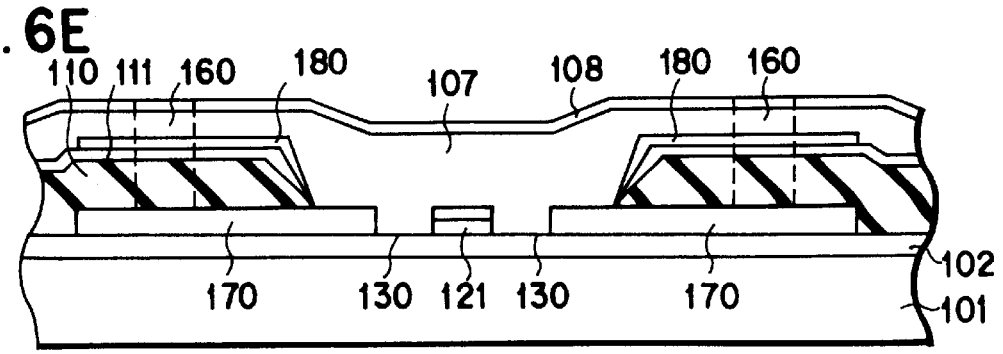

Thereafter, two holes 160 are made in the layers 108, 107, 111 and 110, reaching the active regions 122, respectively, as in the fourth embodiment. Etchant is applied through these holes 160. This etchant is a selective one which with InGaAsP only, not with InP. The InGaAsP active layers 122 and the InGaAsP layers 112 are therefore etched at all, thereby providing spaces 170 and spaces 180, as is shown in FIG. 6F.

The fifth embodiment has not only spaces 170 but also the spaces 180. Hence, the leakage current flows through the junctions 130 but in a smaller amount than in the fourth embodiment.

A sixth embodiment of the present invention will be described. The sixth embodiment is an InGaAsP/InP semiconductor laser which comprises an n-type InP substrate and a self-aligned constricted mesa. How the sixth embodiment is manufactured will be explained, with reference to FIGS. 7A to 7F.

Figure 7A:
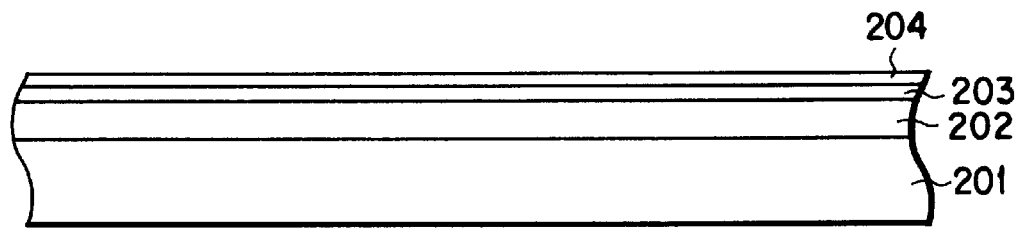
FIGS. 7A to 7F are views explaining a method of manufacturing a sixth embodiment of the invention, FIGS. 7A, 7B, 7D and 7F being sectional views, while FIGS. 7C and 7E being plane views.

As shown in FIG. 7A, an n-type InP buffer layer 202, an undoped InGaAsP active layer 203 and a p-type InP layer 204 are successively formed on a (100) n-type InP substrate 201 by MOVPE method. A double heterostructure is thereby formed.

Figure 7B:
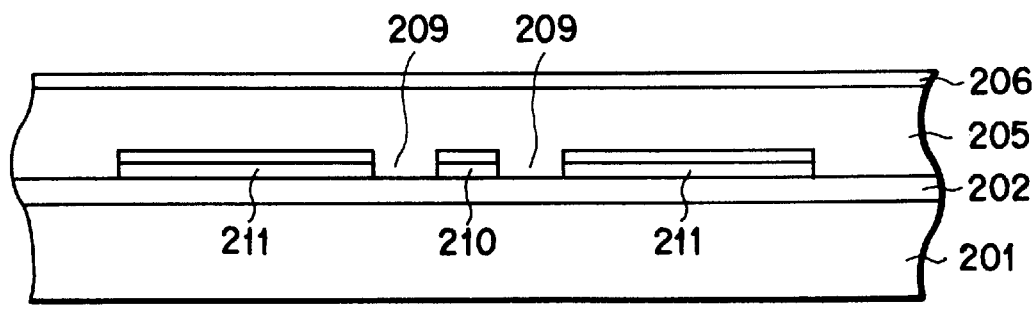

Next, as shown in FIG. 7B, two groove 209, each having a width of about 1 µm, are formed in the active layer 203 and the p-type InP layer 204, thereby forming a stripe-shaped active layer 210. At the same time, the layers 203 and 204 are etched, forming two stripe-shaped active regions 211 located outside the grooves 209 and having a width of about 10 µm, as in the fourth embodiment. Spaces can therefore be provided which are not opened but semi-closed. The spaces will be defined by bridge-shaped structure, each having two supports. A p-type InP layer 205 is grown on the exposed parts of the n-type InP buffer layer 202 and on the p-type InP layer 204, filling both grooves 209. Further, a $p^+$-type InGaAsP ohmic contact layer 206 is grown on the p-type InP layer 205. Thus obtained in the structure shown in FIG. 7B.

Figure 7C:
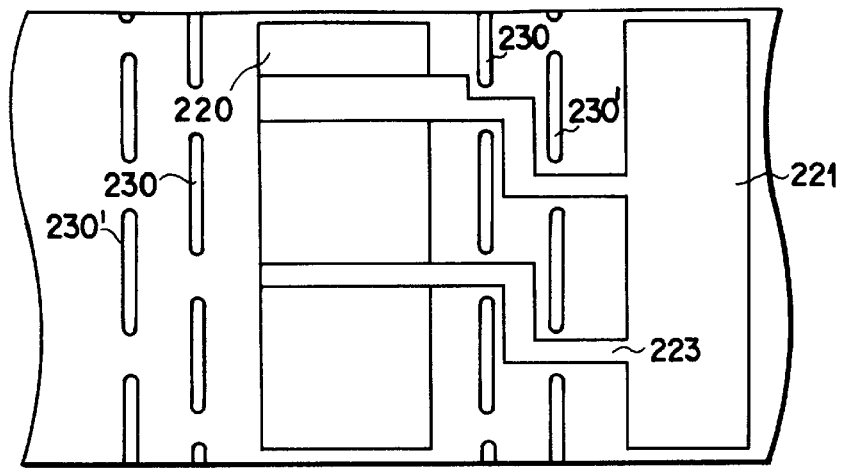
Figure 7D:
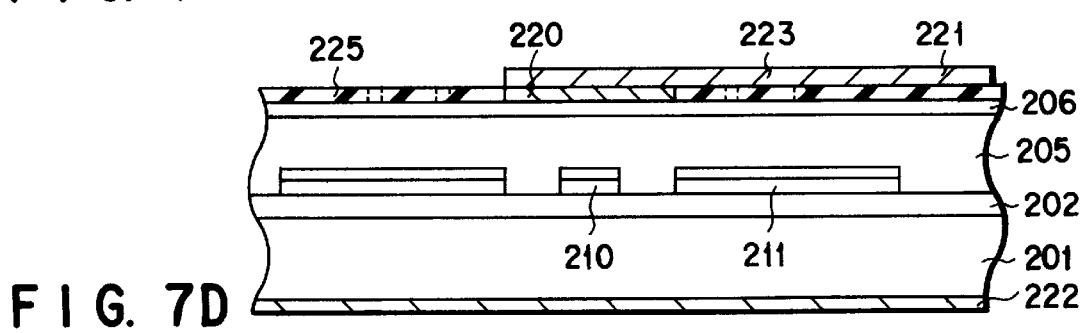

A thin $SiO_2$ film 225 is deposited on the InGaAsP ohmic contact layer 206 as shown in FIG. 7D. A resist (not shown)

is coated on the SiO$_2$ film 225. The resist is patterned, whereby a stripe-shaped opening is formed in the resist. The stripe-shaped opening is located above the stripe-shaped active layer 210, both grooves 209 and parts of the active regions 211. Using the resist as a mask, the SiO$_2$ film 225 is selectively etched. A stripe-shaped opening is thereby formed in the SiO$_2$ film 225, exposing a part of the InGaAsP ohmic contact layer 206. An AuZn film 220 is deposited on the resist (not shown) and also on the exposed part of the ohmic contact layer 206. This done, the resist is removed. The AuZn film 220 is thereby removed, except for that part deposed on the ohmic contact layer 206. This part of the AuZn film 220, formed by so-called lift-off method, serves as a p-side contact electrode 220 which is connected to the InGaAsP ohmic contact layer 206. Then, the resultant structure is annealed, whereby the junction between the contact electrode 220 and the ohmic contact layer 206 functions as an ohmic contact.

Next, a Ti/Pt/Au multi-layer film is deposited on the AuZn contact electrode 220 and the SiO$_2$ film 225. The multi-layer structure is patterned and etched, thus forming a bonding pad 221 and metalization connection 223 as shown in FIG. 7C. The patterned metal 223 connect the AuZn contact electrode 220 to the bonding pad 221. The Au film, i.e., the uppermost metal film of the Ti/Pt/Au multi-layer structure, is made relatively thick to help achieve successful wire bonding on the pad.

Further, an n-side contact electrode 222 is formed on the lower surface of the n-type InP substrate 201. An electrode 222 is made of an AuGe/Ni/Au multi-layer film. Those parts of the SiO$_2$ film 225 which are located right above the active regions 211 are subjected to selective etching. As shown in FIG. 7C, two columns of slits 230 and 230' are thereby formed in that part of the SiO$_2$ film 225 which lies above one active region 211, and two other columns of slits 230 and 230' in that part of the SiO$_2$ film 225 which lies above the other active region 211. The slits of any column are about 2 μm wide and about 100 μm long. Each slit is spaced from either adjacent one of the same column by a distance of about 2 μm. Each column of slits 230 is spaced from the adjacent column of slits 230' by a distance of about 3 μm. The slits 230 of either inner column are staggered with respect to those 230' of the adjacent outer column as seen from FIG. 7C.

Figure 7E:
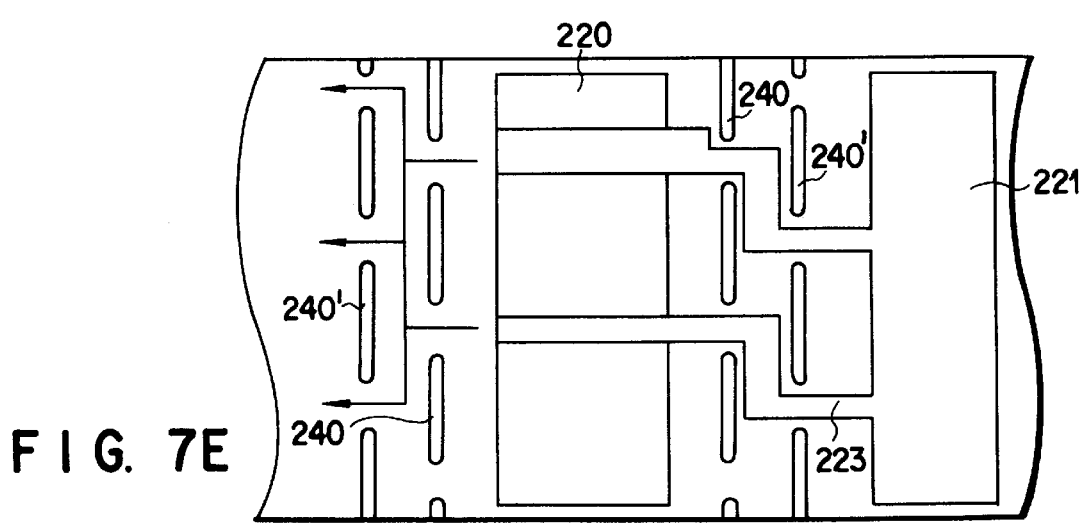
Figure 7F:
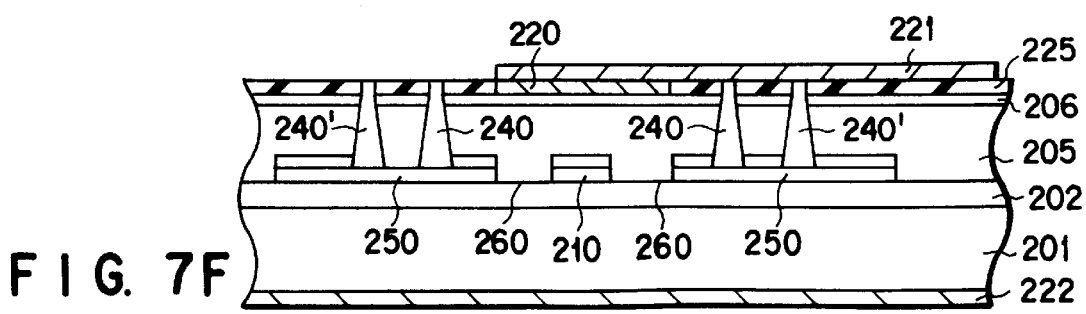

Furthermore, the metalized connection 223 cross none of the slits 230 and 230'. Each wire 223 have a width of about 2 μm and is bent, extending through the gaps among the slits 230 and 230' as illustrated in FIG. 7C. If each metal connection pattern 223 were not so bent, it should be about 50 μm shorter. Using the SiO$_2$ film 225 having the slits 230 and 230' as a mask, the p$^+$-type InGaAsP contact layer 206 is selectively etched with H$_2$SO$_4$+H$_2$O+H$_2$O-based etchant. This etchant is a selective one which with InGaAsP only, not with InP. Using the InGaAsP contact layer 206 as a mask, HCl-base etchant is applied. Only the p-type InP 205 is thereby etched, and the etching automatically stops at the InGaAsP active regions 211. This is because the HCl-based etchant reacts with InP only, not with InGaAsP. As a result, slits 240 and 240' which reach the InGaAsP active regions 211, as is illustrated in FIGS. 7E and 7F.

Then, H$_2$SO$_4$+H$_2$O+H$_2$O-based etchant is applied through these slits 240 and 240', selectively etching only those parts of the InGaAsP active regions 211 which are located outside the grooves 209. This etching is automatically terminated, because those parts of the InP layer 205 which fill the grooves 209 therefore serve as etching stoppers. As a result, spaces 250 are provided as shown in FIG. 7F, and two narrow InP forward junctions 260 are formed on both sides of the stripe-shaped active layer 210. The forward junctions 260 are flush with the lower surface of the stripe-shaped active layer 121, i.e., the (100) face. The leakage current flows through the junctions 130 but in a very small amount. This increases the reliability of the InGaAsP/InP semiconductor laser.

The p-type InP layer 205 has its outer edge set in contact with the n-type InP buffer layer 202, forming a bridge structure. The self-aligned constricted mesa of the fourth embodiment is therefore be mechanically stronger than the conventional self-aligned constricted mesa.

Since the slits 240 and 240' are spaced apart from one another in the lengthwise direction of the stripe-shaped active layer 210, the metal connection 223 can be arranged planarly without passing over the slits 240 or 240' and, thus, avoiding the stepped portions.

When a voltage is applied in the forward direction between the p-side contact electrode 220 and the n-side contact electrode 222, the current flows to the InP substrate 201 through the active layer 210 and either the InP forward junction 260 or the InP layer 205. The arrows shown in FIG. 7E indicates the paths of the current flowing through the p-type InP layer 205. Each of these current paths is bent, passing through a gap between the space 250 and the SiO$_2$ film 225, a gap between two adjacent slits 240 and 240' and a gap between two adjacent slits 240 (or 240') of the same column.

The path element limit the current flow is the p-type InP layer 205 which is 2 μm wide and 50 μm long. If the layer 205 has a carrier concentration of 1E18 cm$^{-3}$, its resistivity will be about 9E-2 Ω·cm. If the layer 205 is 1.5 μm thick, the current path will have the following resistance:

$$9E2\,\Omega\cdot\mu m \times 50\ \mu m/(2\ \mu m \times 1.5\ \mu m) = 15\ k\Omega$$

The sixth embodiment shown in FIG. 7E has several current path elements. Since the current path elements are connected in parallel, their total resistance is 1 kΩ more or less. To increase the total resistance, it suffices to impart a higher resistance to each of the unit current paths. To this end, each current path may only need to be made narrower. Alternatively, three or more columns of labyrinthine slits may be made so that each current path becomes longer. Still alternatively, the carrier concentration of the p-type InP layer 205 may be reduced. Further, in order to increase the total resistance of the current paths, the paths may be decreased in number by lengthening the slits so that each column consists of less slits. Still further, these various methods may be employed in combination to increase the total resistance of the current paths.

Once the total resistance of the current paths in the p-type InP layer 205 is thus reduced, it becomes possible to constrict the current flowing to the stripe-shaped active layer 210.

A seventh embodiment of this invention will be described. The seventh embodiment is an InGaAsP/InP semiconductor laser which is provided on an n-type InP substrate. How the seventh embodiment is manufactured will be explained, with reference to FIGS. 8A to 8I.

Figure 8A:
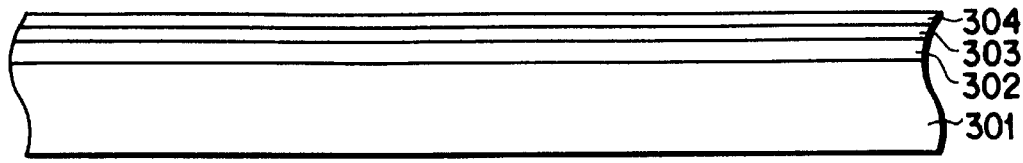
FIGS. 8A to 8I are views explaining a method of manufacturing a seventh embodiment of this invention, FIGS. 8A to 8C and 8E to 8H being sectional views, while FIGS. 8D and 8I being plan views.

As shown in FIG. 8A, an n-type InP buffer layer 302, an undoped InGaAsP active layer 303 and a p-type InP layer 304 are formed on a (100) n-type InP substrate 301 by MOVPE method, one upon another in the order they are mentioned. A double heterostructure is thereby formed.

Figure 8B:
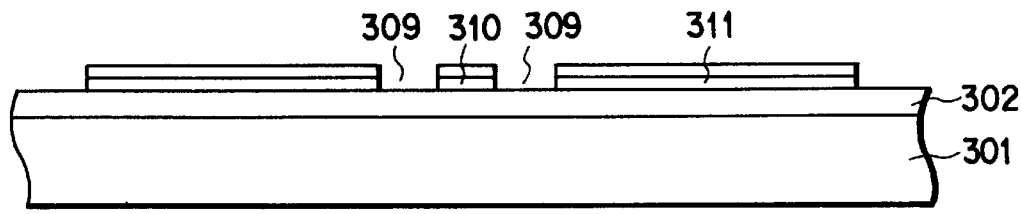

Next, as shown in FIG. 8B, two groove 309, each having a width of about 1 μm, are formed in the active layer 303 and the p-type InP layer 304, thereby forming a stripe-shaped active layer 310. At the same time, the layers 303 and 304 are etched, forming two stripe-shaped active regions 311 located outside the grooves 309 and having a width of about 5 μm.

Figure 8C:
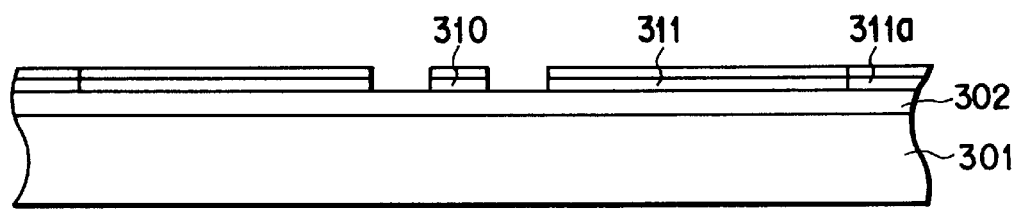
Figure 8D:
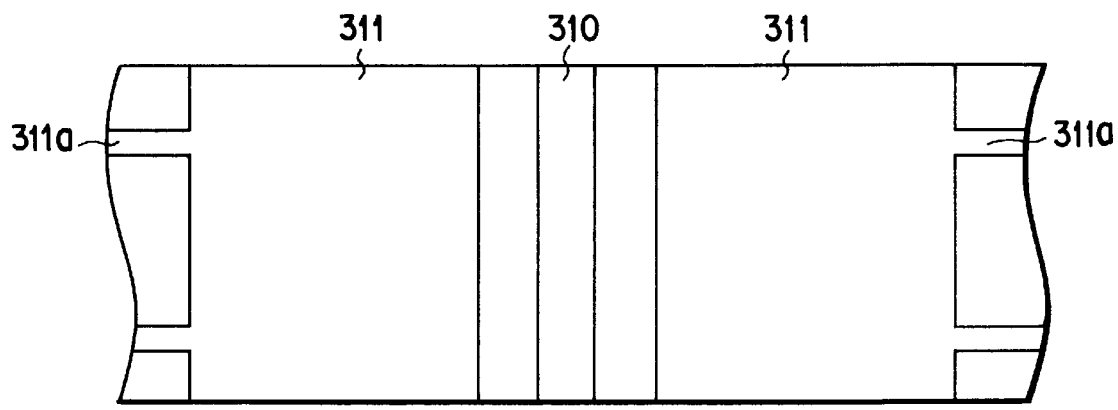
Figure 8E:
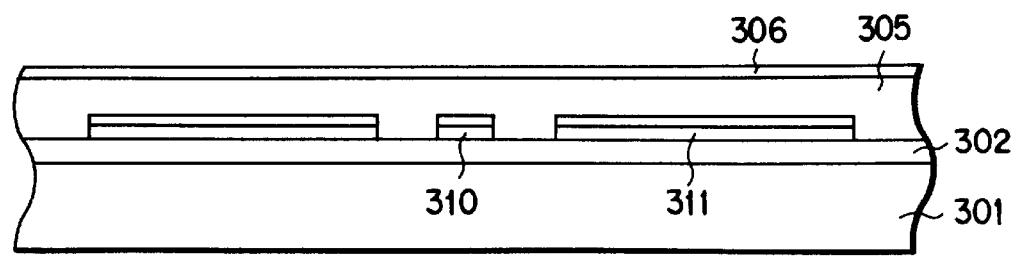

As shown in FIG. 8E, a p-type InP layer 305 is grown on the p-type InP layer 304 all over the exposed parts of the n-type InP buffer layer 302, filling both grooves 309. The layer 305 has a flat upper surface. A p$^+$-type InGaAsP ohmic contact layer 306 is grown on the p-type InP layer 305.

Figure 8F:
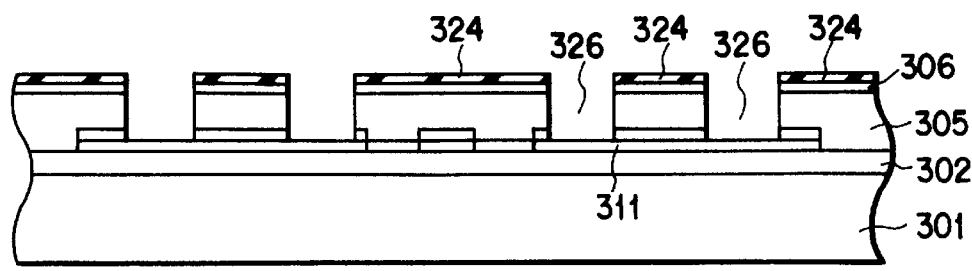

A thin SiO$_2$ film 324 is deposited on the InGaAsP ohmic contact layer 306 as shown in FIG. 8F. The SiO$_2$ film 324 is selectively etched, forming two stripe-shaped openings located above the first active region 311 and two other stripe-shaped openings located above the second active region 311. Using the SiO$_2$ film 324 thus etched, as a mask, the p-type InGaAsP ohmic contact layer 306 is etched with H$_2$SO$_4$+H$_2$O+H$_2$O-based etchant, and the p-type InP layer 305 is then etched with HCl. This etching is automatically stopped at the active regions 311. As a result, two grooves 326 are made for each active region 311, exposing two parts thereof. The grooves 326 may have the same length as the active region 311, with their ends aligned with those of the active region 311, or may be longer than the active region 311, with their ends located outside those of the active region 311.

Figure 8G:
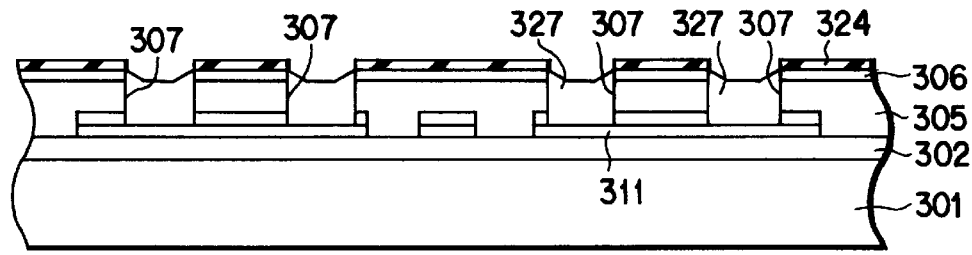

An n-type InP layer 327 is grown all over the layers, except those of the SiO$_2$ film 324, thereby filling the grooves 326, as illustrated in FIG. 8G. As a result of this, reverse-bias junctions 307 are formed on one side surfaces of the grooves 327 which are far from the active layer 310, each at the interface between an n-type InP layer 327 and a p-type InP layer 305.

Figure 8H:
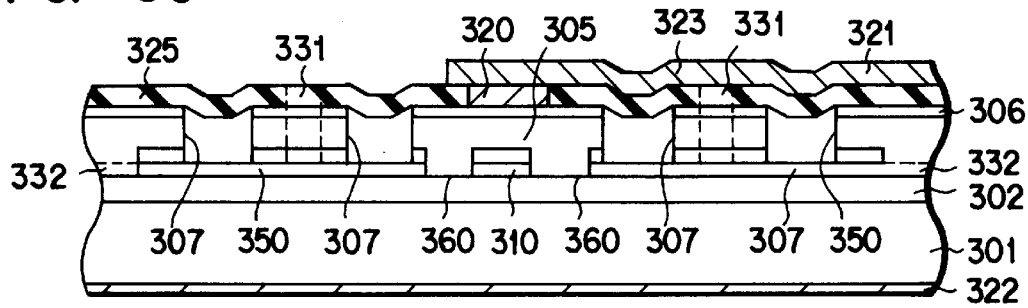

Next, as shown in FIG. 8H, the SiO$_2$ film 324 is removed, and an SiO$_2$ film 325 is deposited on the n-type InP layer 327 and the p-type InGaAsP ohmic contact layer 306. A stripe-shaped opening is made in the SiO$_2$ film 325, thus exposing a part of the p-type InGaAsP ohmic contact layer 306. The opening is located right above the stripe-shaped active layer 310. A stripe-shaped AuZn, p-side contact electrode 320 is formed on the exposed part of the ohmic contact layer 306 by means of lift-off method. Then, the resultant structure is annealed, whereby the junction between the p-side contact electrode 320 and the ohmic contact layer 306 functions as an ohmic contact. Further, a Ti/Pt/Au multi-layer film is deposited on the AuZn contact electrode 320 and the SiO$_2$ film 325. The multi-layer structure is patterned by photolithography, forming a bonding pad (not shown) and metalized patterns 321 and 323, as shown in FIG. 8H. The metals 321 and 323 connect the AuZn contact electrode 320 to the bonding pad. The Au film, i.e., the uppermost metal film of the Ti/Pt/Au multi-layer structure, is made relatively thick to help achieve successful wire bonding.

Further, an n-side contact electrode 322 is formed on the lower surface of the n-type InP substrate 301. The electrode 322 is made of a Ti/Pt/Au multi-layer film.

Figure 8I:
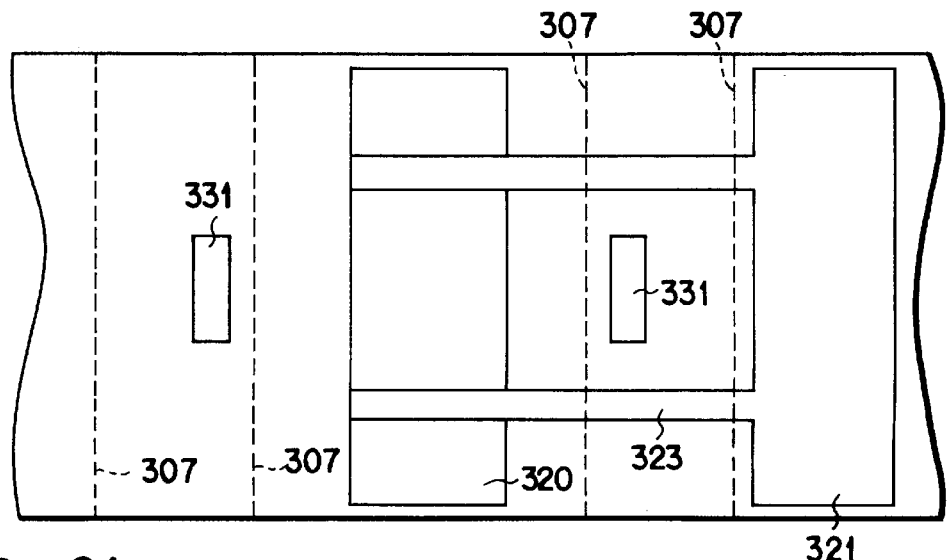

Next, the SiO$_2$ film 325, InGaAsP layer 306 and p-type InP layer 305 are selectively etched, or the SiO$_2$ film 325 and the n-type InP layer 327 are selectively etched, thereby forming vertical holes 331 as shown in FIGS. 8H and 8I. The holes 331 reach the stripe-shaped active regions 311.

The active regions 311 may have a projection 311a each, as is shown in FIGS. 8C and 8D. The projections 331a extend away from the stripe-shaped active layer 310. The projections 311a are exposed by means of etching or cleaving, after the p-side contact electrode 320 and the wires 321 have been formed. The projections 311a are etched away, thereby forming horizontal holes 332 as shown in FIG. 8H.

Then, H$_2$SO$_4$+H$_2$O+H$_2$O-based etchant is applied through either the vertical holes (slits) 331 or the horizontal holes (slits) 332, thereby etching away the InGaAsP active regions 311 only. In this process, those parts of the InP layer 305 which fill the grooves 309 serve as etching stoppers, terminating the etching at the grooves 309. As a result, spaces 350 are provided as shown in FIG. 8H.

The spaces 350 are not opened but semi-closed. The p-type InP layer 305 contacts the n-type InP buffer layer 302 at the ends of the spaces 350, forming a bridge structure. The self-aligned constricted mesa of the fourth embodiment is therefore be mechanically stronger than the conventional self-aligned constricted mesa.

Since the holes 331 are spaced apart from one another in the lengthwise direction of the stripe-shaped active layer 310, the wires 323 can be arranged without passing over the holes and, thus, without having stepped portions.

The paths of the current flowing in the InP layer 305 covering the spaces 350 extend through the reverse-bias junctions 307 as shown in FIGS. 8H and 8I. The junctions 307 are located between the SiO$_2$ film 325 and either space 350. Hence, the current flowing from the p-side contact electrode 320 to the n-side contact electrode 322 via the p-type InP layer 305 covering the spaces 350 is completely blocked by the two concentric reverse-bias junctions 307. The current can therefore be constructed in the stripe-shaped active layer 310.

Since the p-type InP layer 305 has a thickness of only about 1 μm, each reverse-bias junction 307 has a very small junction area and generates, if any, a very small parasitic capacitance. The seventh embodiment (i.e., an InGaAsP/InP semiconductor laser) can therefore operate at high speed.

In the seventh embodiment, the n-type InP layer 327 must be formed by selective growth. Made by selective growth, the layer 327 can hardly have a flat upper surface. In order to perform the selective growth a massive and complicated apparatus must be used, inevitably increasing the manufacturing cost of the semiconductor laser. Further, currents are likely to leak at the reverse-bias junctions 307, because the junctions 307 are provided at the interfaces between the InP layer 327 and the InP layer 305, which are exposed by etching. Consequently, the semiconductor laser may not be so reliable as desired.

The eighth embodiment of the invention will be described which solves these problems. The eighth embodiment is an InGaAsP/InP semiconductor laser which is provided on an n-type InP substrate. The eighth embodiment is characterized in that the reverse-bias junctions are formed by diffusing impurities, generally p-type dopant. Hence, this semiconductor laser is provided on a p-type InP substrate, not on an n-type InP substrate as the seventh embodiment. How the eighth embodiment is manufactured will be explained, with reference to FIGS. 9A to 9F.

Figure 9A:
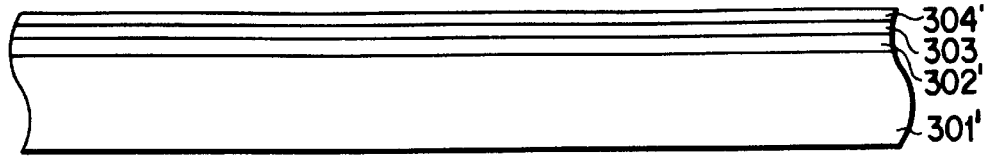
FIGS. 9A to 9F are sectional views explaining a method of manufacturing an eighth embodiment of the present invention.

As shown in FIG. 9A, a p-type InP buffer layer 302', an undoped InGaAsP active layer 303 and an n-type InP layer 304' are grown on a (100) p-type InP substrate 301', one upon another in the order they are mentioned. A double heterostructure is thereby formed.

Figure 9B:
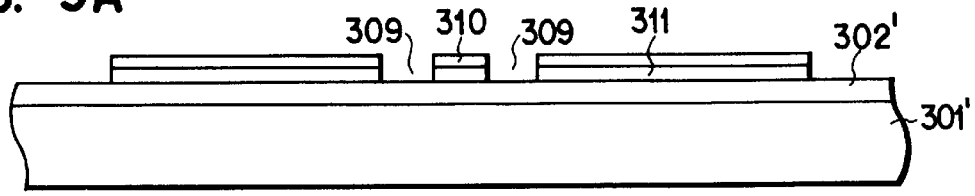

Next, as shown in FIG. 9B, two groove 309, each having a width of about 1 μm, are formed in the n-type InP layer 304' and InGaAsP active layer 303, thereby forming a stripe-shaped active layer 310. At the same time, the layers 303 and 304' are etched, forming two stripe-shaped active regions 311 located outside the grooves 309 and having a width of about 5 μm.

Figure 9C:
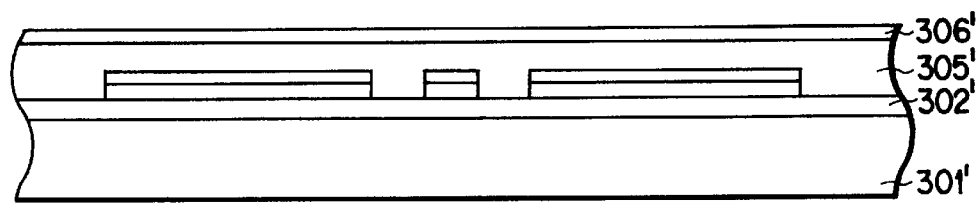

As shown in FIG. 9C, an n-type InP layer 305' is grown on the n-type InP layer 304' and on the exposed parts of the p-type InP buffer layer 302', filling both grooves 309. A n-type InGaAsP ohmic contact layer 306' is grown on the p-type InP layer 305.

Figure 9D:
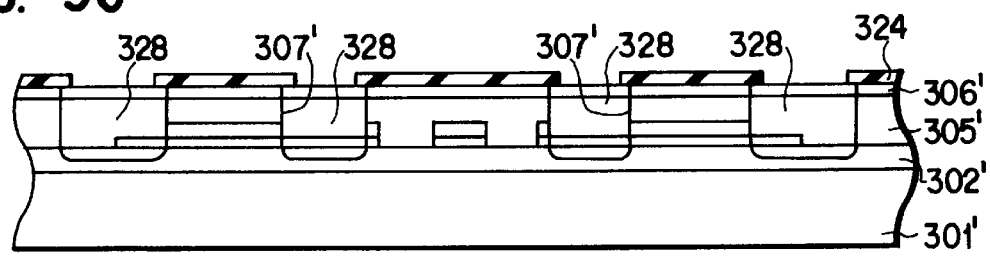

A thin $SiO_2$ film 324 is deposited on the n-type InGaAsP ohmic contact layer 306' as shown in FIG. 9D. The $SiO_2$ film 324 is selectively etched, forming two stripe-shaped openings located above the first active region 311 and two other stripe-shaped openings located above the second active regions 311. Using the $SiO_2$ film 324 thus etched, as a mask, Zn, for example, is diffused into the layers 306' and 305', thereby forming Zn-diffusion regions 328 which are deep enough to reach the upper surfaces of the InGaAsP active region 311. As a result of this, a reverse-bias junction 307' is formed between each Zn-diffusion region 328 and the n-type InP layer 305'. The reverse-bias junction 307' is longer than or as long as the active region 311. Alternatively, both ends of the junction 307' are exposed in spaces or contact insulating layers. The junction 307' reliably blocks the currents flowing in those parts of the InP layer 305 which exist above the active regions 311.

Figure 9E:
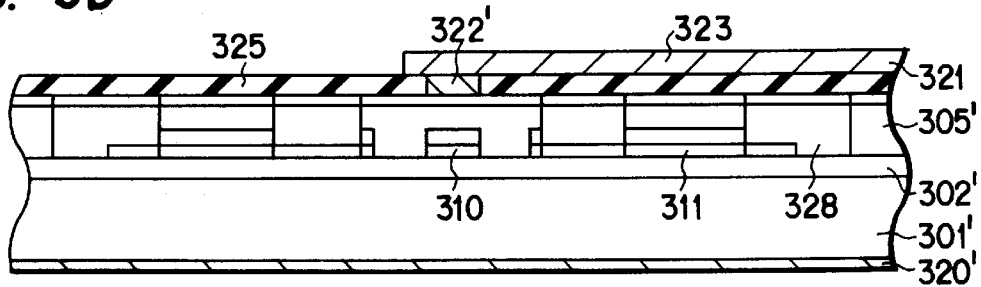

Next, as shown in FIG. 9E, the $SiO_2$ film 324 is removed, and an $SiO_2$ film 325 is deposited on the InGaAsP ohmic contact layer 306' and the Zn-diffusion regions 328. A stripe-shaped opening is made in the $SiO_2$ film 325, thus exposing a part of the n-type InGaAsP ohmic contact layer 306'. The opening is located right above the stripe-shaped active layer 310. A stripe-shaped AuZn contact electrode 322' is formed on the exposed part of the ohmic contact layer 306' by means of lift-off method. Further, a Ti/Pt/Au multi-layer film is deposited on the AuZn contact electrode 322' and the $SiO_2$ film 325. The multi-layer structure is patterned by photolithography, forming a bonding pad (not shown) and metalized patterns 321 and 323, as shown in FIG. 8H. The metals 321 and 323 connect the AuZn contact electrode 322' to the bonding pad. The Au film, i.e., the uppermost metal film of the Ti/Pt/Au multi-layer structure, is made relatively thick to help achieve successful wire bonding. Further, a p-side contact electrode 320' is formed on the lower surface of the InP substrate 301'. The electrode 320' is made of AuZn.

Figure 9F:
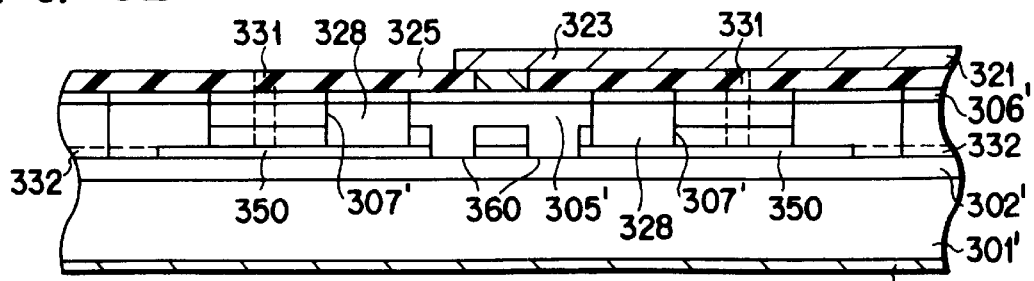
Figure 11A:
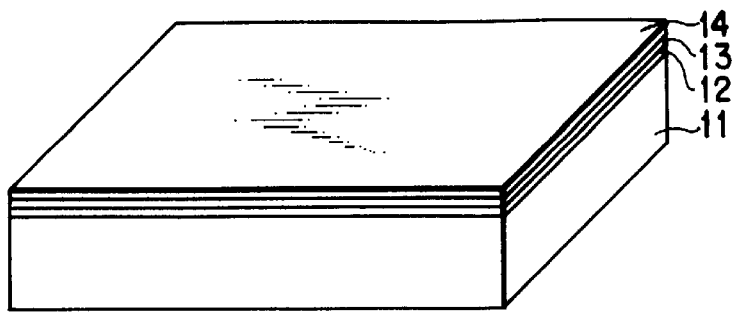
FIGS. 11A to 11E are cross sectional views explaining a method of manufacturing a conventional semiconductor laser which has a self-aligned constricted mesa.
Figure 11B:
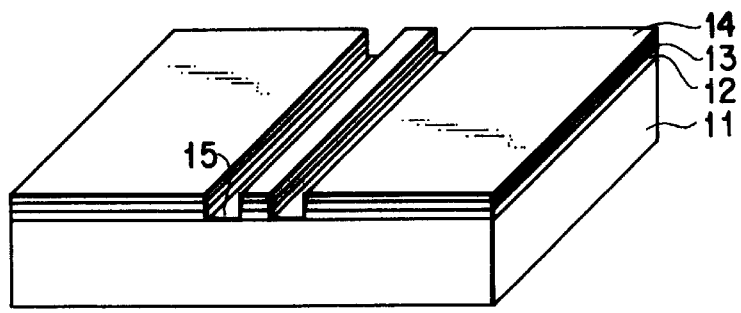
Figure 11C:
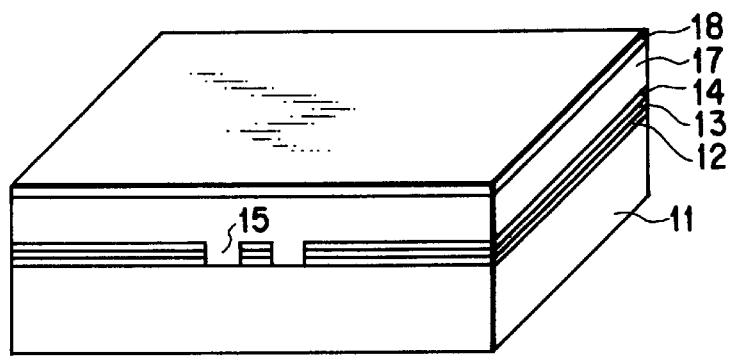
Figure 11D:
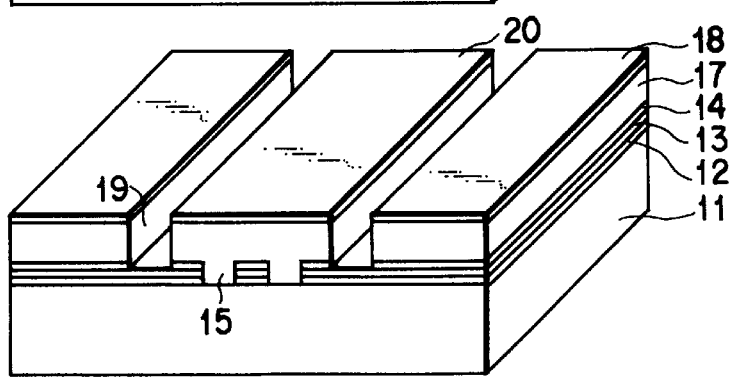
Figure 11E:
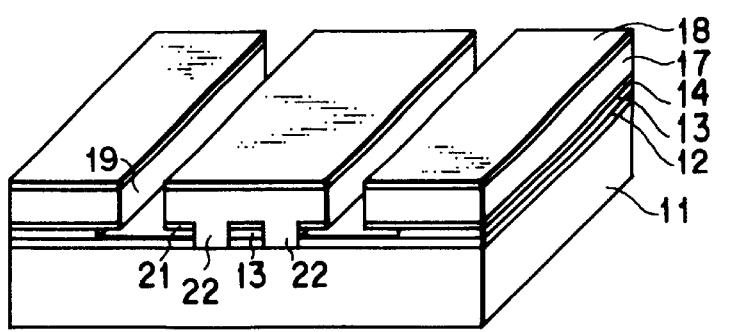

Next, as shown in FIG. 9F, vertical holes (slits) 331 or horizontal holes (slits) 332, reaching the stripe-shaped active regions 311, are made in the same way as in the seventh embodiment.

$H_2SO_4+H_2O+H_2O$-based is applied through either the vertical holes 331 or the horizontal holes 332, thereby etching away the InGaAsP active regions 311 only. In this process, those parts of the InP layer 305' which fill the grooves 309 serve as etching stoppers, terminating the etching at the grooves 309. As a result, spaces 350 are provided as shown in FIG. 9F. The top view of this semiconductor laser is identical to FIG. 8I.

Both ends of each Zn-diffusion region 328 are exposed in spaces or contact insulating layers. In other words, the spaces 350 are not opened but half-closed. The n-type InP layer 305' contacts the p-type InP buffer layer 302' at the ends of the spaces 350, forming a bridge structure. The self-aligned constricted mesa of the fourth embodiment is therefore be mechanically stronger than the conventional self-aligned constricted mesa.

Since the holes 331 are spaced apart from one another in the lengthwise direction of the stripe-shaped active layer 310, the wires 321 can be arranged without passing over the holes and, thus, avoiding the stepped portions.

The path of the current flowing in the InP layer 305 covering the spaces 350 extends through the reverse-bias junction 307'. The junction 307' is located between the $SiO_2$ film 325 and the space 350. Hence, the current flowing from the p-side contact electrode 320' to the n-side contact electrode 322' via the p-type InP layer 305' covering the spaces 350 is completely blocked by the concentric reverse-bias junction 307'. The current can therefore be constructed in the stripe-shaped active layer 310.

Since the n-type InP layer 305' has a thickness of only about 1 $\mu$m, the reverse-bias junction 307' has a very small junction area and generates, if any, a very small parasitic capacitance. The eighth embodiment (i.e., an InGaAsP/InP semiconductor laser) can therefore operate at high speed.

Moreover, the reverse-bias junction 307' is electrically more reliable than its counterparts 307 of the seventh embodiment. This is because the junction 307' has been formed by diffusing impurities, not provided at etched and exposed interfaces as in the seventh embodiment.

Two concentric reverse-bias junctions 307 are provided above the spaces 250 in the seventh embodiment, and one reverse-bias junction 307' is provided above the spaces 250 in the eighth embodiment. Instead, three or more concentric reverse-bias junctions may be provided so as to reduce the leakage current more.

Furthermore, in the first to eighth embodiments described above, the spaces may be partly or completely filled with insulating material or polyimide by means of, for example, plasma CVD method. If this is the case, the embodiments will be mechanically stronger. In any embodiment described above, the layer which are etched in part, providing spaces, is made of InGaAsP. Nevertheless, it may be replaced by an InGaAs layer.

In any embodiment described above, an InP buffer layer of a first conductivity type, an InGaAsP active layer and an InP layer of the second conductivity type are sequentially grown, in the order mentioned, on an InP substrate of the first conductivity type. The InP layer of the second conductivity type may be replaced by an InGaAsP waveguide layer. To manufacture a DFB laser, the InGaAsP waveguide layer must be processed to have parallel grooves in its surface as shown in FIG. 5. These grooves need to which extend at right angles to the stripe-shaped active layer, thus providing a diffraction grating.

The embodiments described above are semiconductor lasers having a self-aligned constricted mesa. Nevertheless, the present invention is not limited to this type of a semiconductor laser. Rather, it can be applied to various types of semiconductor devices in which a current is constricted at the main pn-junction. For example, the invention may be applied to an electron-absorption modulator (EAM) which has a waveguide. Moreover, the invention may be applied to electronic devices such as HBTs (Heterojunction Bipolar Transistors) and also to various semiconductor devices each having pn-junctions, such as light-emitting elements (including lasers), light-receiving elements, amplifiers and light amplifiers.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A semiconductor device comprising:
   a semiconductor substrate of a first conductivity type;
   a first cladding layer of the first conductivity type provided on said semiconductor substrate;

a stripe-shaped active layer provided on said first cladding layer;

a second cladding layer of a second conductivity type provided on said active layer;

a burying layer covering said active layer and formed on a portion of said first cladding layer left exposed by the stripe-shaped active layer;

a first space provided outside said burying layer and above said first cladding layer;

a first semiconductor layer provided above said first space;

a second space provided above said first semiconductor layer; and a second semiconductor layer provided above said second space.

2. A semiconductor device according to claim 1, wherein said first and second spaces are filled, at least in part, with insulating material.

3. A semiconductor device according to claim 1, wherein said active layer is made of InGaAsP, said first and second cladding layers are made of InP, and said burying layer is made of InP.

4. A semiconductor device according to claim 1, wherein said active layer serves as an active layer of a semiconductor laser.

5. A semiconductor device according to claim 1, wherein a junction is provided below said active layer and is a part of a semiconductor light-emitting element, semiconductor light-receiving element, modulator, light amplifier or transistor.

6. A semiconductor device comprising:

a semiconductor substrate of a first conductivity type;

a first cladding layer of the first conductivity type provided on said semiconductor substrate;

a stripe-shaped active layer provided on said first cladding layer;

a second cladding layer of a second conductivity type provided on said active layer;

a burying layer covering said active layer and formed on a portion of said first cladding layer left exposed by the stripe-shaped active layer;

a first space provided outside said burying layer and above said first cladding layer;

a first semiconductor layer provided above said first space;

a second space provided above said first semi-conductor layer;

a second semiconductor layer provided above said second space; and a semiconductor column provided outside said burying layer, surrounded by said first space, said first semiconductor layer and said second space, and having an upper surface and a lower surface which contact said second semiconductor layer and said first cladding layer, respectively.

7. A semiconductor device according to claim 6, wherein said first and second spaces are filled, at least in part, with insulating material.

8. A semiconductor device according to claim 6, wherein said active layer is made of InGaAsP, said first and second cladding layers are made of InP, and said burying layer is made of InP.

9. A semiconductor device according to claim 6, wherein said active layer serves as an active layer of a semiconductor laser.

10. A semiconductor device according to claim 6, wherein a junction is provided below said active layer and is a part of a semiconductor light-emitting element, semiconductor light-receiving element, modulator, light amplifier or transistor.

11. A semiconductor device comprising:

a semiconductor substrate of a first conductivity type;

a first cladding layer of the first conductivity type provided on said semiconductor substrate;

a stripe-shaped active layer provided on said first cladding layer;

a second cladding layer of a second conductivity type provided on said active layer;

a burying layer covering said active layer and formed on a portion of said first cladding layer left exposed by the stripe-shaped active layer;

a first space provided outside said burying layer and above said first cladding layer;

a first semiconductor layer provided above said first space;

a second space provided above said first semi-conductor layer;

a second semiconductor layer provided above said second space;

first semiconductor columns, each provided outside said burying layer, surrounded by said first space, and having an upper surface and a lower surface which contact said second semiconductor layer and said first cladding layer, respectively; and second semiconductor columns, each provided outside said burying layer and at a position other than that position which is above said first semiconductor column, surrounded by said second space, and having an upper surface and a lower surface which contact said second semiconductor layer and said first semiconductor layer, respectively.

12. A semiconductor device according to claim 11, wherein said first semiconductor columns and said second semiconductor columns are alternately arranged in a direction in which said active layer extends.

13. A semiconductor device according to claim 11, wherein said first and second spaces are filled, at least in part, with insulating material.

14. A semiconductor device according to claim 11, wherein said active layer is made of InGaAsP, said first and second cladding layers are made of InP, and said burying layer is made of InP.

15. A semiconductor device according to claim 11, wherein said active layer serves as an active layer of a semiconductor laser.

16. A semiconductor device according to claim 11, wherein a junction is provided below said active layer and is a part of a semiconductor light-emitting element, semiconductor light-receiving element, modulator, light amplifier or transistor.

17. A semiconductor device comprising:

a semiconductor substrate;

a stripe-shaped active layer provided on a part of said semiconductor substrate;

a burying layer surrounding said active layer and formed on a portion of said semiconductor substrate left exposed by the stripe-shaped active layer;

a space surrounding said burying layer and provided above said semiconductor substrate;

a semi-insulating semiconductor layer provided above said space; and a diffusion-preventing layer provided between said burying layer and said semi-insulating semiconductor layer, for preventing impurities from diffusing from said burying layer into said semi-insulating semiconductor layer.

18. A semiconductor device according to claim 17, wherein said burying layer is made of p-type InP, said semi-insulating semiconductor layer is made of semi-insulating InP, and said diffusion-preventing layer is made of n-type InP.

19. A semiconductor device according to claim 17, wherein said active layer serves as an active layer of a semiconductor laser.

20. A semiconductor device according to claim 17, wherein a junction is provided below said active layer and is a part of a semiconductor light-emitting element, semiconductor light-receiving element, modulator, light amplifier or transistor.

21. A semiconductor device according to claim 17, wherein said space is filled, at least in part, with insulating material.

22. A semiconductor device comprising:

a semiconductor substrate;

a stripe-shaped active layer provided on a part of said semiconductor substrate;

a burying layer surrounding said active layer and formed on a portion of said semiconductor substrate left exposed by the stripe-shaped active layer;

a first space surrounding said burying layer and provided above said semiconductor substrate;

a semi-insulating semiconductor layer provided above said first space;

a diffusion-preventing layer provided between said burying layer and said semi-insulating semiconductor layer, for preventing impurities from diffusing from said burying layer into said semi-insulating semiconductor layer; and a second space provided in at least in one part of an interface between said diffusion-preventing layer and said burying layer.

23. A semiconductor device according to claim 22, wherein said burying layer is made of p-type InP, said semi-insulating semiconductor layer is made of semi-insulating InP, and said diffusion-preventing layer is made of n-type InP.

24. A semiconductor device comprising:

a semiconductor substrate;

a stripe-shaped active layer provided on a part of said semiconductor substrate;

a semiconductor layer covering said active layer;

a space provided in said semiconductor layer, spaced from said active layer and located above said semiconductor substrate; and at least two columns of slits extending along said active layer and made in that part of said semiconductor layer which is located above said space.

25. A semiconductor device according to claim 24, wherein the slits of one column are staggered with respect of the slits of the other column.

26. A semiconductor device according to claim 24, wherein wires are provided on said semiconductor layer, each extending between two adjacent slits of each column.

27. A semiconductor device according to claim 24, wherein said semiconductor substrate is made of InP, said active layer is made of InGaAsP, and said semiconductor layer is made of InP.

28. A semiconductor device according to claim 24, wherein said active layer serves as an active layer of a semiconductor laser.

29. A semiconductor device according to claim 24, wherein a junction is provided below said active layer and is a part of a semiconductor light-emitting element, semiconductor light-receiving element, modulator, light amplifier or transistor.

30. A semiconductor device according to claim 24, wherein said space is filled, at least in part, with insulating material.

31. A semiconductor device comprising:

a semiconductor substrate;

a stripe-shaped active layer provided on a part of said semiconductor substrate;

a first semiconductor layer of a first conductivity type covering said active layer;

a space provided in said first semiconductor layer, spaced from said active layer and located above said semiconductor substrate; and a second semiconductor layer of a second conductivity type provided in that part of said first semiconductor layer which is located above said space, and dividing said first semiconductor into two parts along said active layer.

32. A semiconductor device according to claim 31, wherein said second semiconductor layer consists of at least two parts, both provided above said space and extending along said active layer.

33. A semiconductor device according to claim 31, wherein said second semiconductor layer has been formed by diffusing impurities into said semiconductor layer.

34. A semiconductor device according to claim 31, wherein said active layer is made of InGaAsP, and said semiconductor substrate, said first semiconductor layer and said second semiconductor layer are made of InP.

35. A semiconductor device according to claim 31, wherein said active layer serves as an active layer of a semiconductor laser.

36. A semiconductor device according to claim 31, wherein a junction is provided below said active layer and is a part of a semiconductor light-emitting element, semiconductor light-receiving element, modulator, light amplifier or transistor.

37. A semiconductor device according to claim 31, wherein said space is filled, at least in part, with insulating material.

* * * * *